United States Patent
Ueda et al.

(10) Patent No.: US 11,483,917 B2
(45) Date of Patent: Oct. 25, 2022

(54) CHAMBER DEVICE, EXTREME ULTRAVIOLET LIGHT GENERATION APPARATUS, AND ELECTRONIC DEVICE MANUFACTURING METHOD

(71) Applicant: Gigaphoton Inc., Tochigi (JP)

(72) Inventors: Atsushi Ueda, Oyama (JP); Takayuki Osanai, Oyama (JP); Koichiro Koge, Oyama (JP)

(73) Assignee: Gigaphoton Inc., Tochigi (JP)

(*) Notice: Subject to any disclaimer, the term of this patent is extended or adjusted under 35 U.S.C. 154(b) by 97 days.

(21) Appl. No.: 17/156,376

(22) Filed: Jan. 22, 2021

(65) Prior Publication Data

US 2021/0289611 A1     Sep. 16, 2021

(30) Foreign Application Priority Data

Mar. 16, 2020     (JP) .............................. JP2020-045225

(51) Int. Cl.
    *H05G 2/00*          (2006.01)
    *G03F 7/20*          (2006.01)
    *G21K 1/06*          (2006.01)

(52) U.S. Cl.
    CPC ......... *H05G 2/003* (2013.01); *G03F 7/70033* (2013.01); *G03F 7/70858* (2013.01); *G03F 7/70916* (2013.01); *G03F 7/70933* (2013.01); *G21K 1/06* (2013.01); *H05G 2/008* (2013.01)

(58) Field of Classification Search
    CPC ........ H05G 2/003; H05G 2/008; H05G 2/005; G03F 7/70033; G03F 7/70933; G03F 7/70916; G03F 7/70858; G21K 1/06

USPC ...................................................... 250/504 R
See application file for complete search history.

(56) References Cited

U.S. PATENT DOCUMENTS

2020/0089124 A1\*   3/2020   Labetski ............. G03F 7/70175
2020/0185212 A1    6/2020   Ueda et al.

FOREIGN PATENT DOCUMENTS

WO      2009/032055 A1     3/2009
WO      2018/127565 A2     7/2018
WO      2019/058430 A1     3/2019

OTHER PUBLICATIONS

A Search Report issued by the Netherlands Patent Office dated Sep. 7, 2021, which corresponds to Dutch Patent Application No. 2027450 and is related to U.S. Appl. No. 17/156,376; with English language Written Opinion.

\* cited by examiner

*Primary Examiner* — Kiet T Nguyen
(74) *Attorney, Agent, or Firm* — Studebaker & Brackett PC

(57) ABSTRACT

A chamber device may include a concentrating mirror, a central gas supply port, an inner wall, an exhaust port, a recessed portion, and a lateral gas supply port. The recessed portion may be on a side lateral to the focal line and recessed outward from the inner wall when viewed from a direction perpendicular to the focal line. The lateral gas supply port is formed at the recessed portion and may supply gas toward gas supplied from the central gas supply port so that a flow direction of the gas supplied from the central gas supply port is bent from a direction along the focal line toward the exhaust port and an internal space of the recessed portion.

18 Claims, 16 Drawing Sheets

CHAMBER DEVICE, EXTREME ULTRAVIOLET LIGHT GENERATION APPARATUS, AND ELECTRONIC DEVICE MANUFACTURING METHOD

CROSS-REFERENCE TO RELATED APPLICATIONS

The present application claims the benefit of Japanese Patent Application No. 2020-045225, filed on Mar. 16, 2020, the entire contents of which are hereby incorporated by reference.

BACKGROUND

1. Technical Field

The present disclosure relates to a chamber device, an extreme ultraviolet light generation apparatus, and an electronic device manufacturing method.

2. Related Art

Recently, miniaturization of a transfer pattern in optical lithography of a semiconductor process has been rapidly proceeding along with miniaturization of the semiconductor process. In the next generation, microfabrication at 10 nm or less will be required. Therefore, it is expected to develop a semiconductor exposure apparatus that combines an apparatus for generating extreme ultraviolet (EUV) light having a wavelength of about 13 nm with a reduced projection reflection optical system.

EUV light generation apparatuses being developed include a laser produced plasma (LPP) type apparatus using plasma generated by irradiating a target substance with a laser beam.

LIST OF DOCUMENTS

Patent Documents
Patent Document 1: International Publication No. WO2018/127565

SUMMARY

A chamber device according to an aspect of the present disclosure includes a concentrating mirror including a spheroidal reflection surface configured to reflect extreme ultraviolet light generated from plasma in a plasma generation region where the plasma is generated from a droplet to which a laser light is radiated, a central gas supply port configured to supply gas along a focal line passing through a first focal point and a second focal point of the reflection surface from a center side of the reflection surface, an inner wall disposed closest to an optical path of the extreme ultraviolet light in the chamber device, an exhaust port configured to exhaust the gas in the chamber device and disposed on a side lateral to the focal line on the opposite side to concentrating mirror with respect to the plasma generation region when viewed from a direction perpendicular to the focal line, a recessed portion disposed on a side lateral to the focal line and recessed outward from the inner wall when viewed from a direction perpendicular to the focal line, and a lateral gas supply port formed at the recessed portion and configured to supply gas toward the gas supplied from the central gas supply port so that a flow direction of the gas supplied from the central gas supply port is bent from a direction along the focal line toward the exhaust port and an internal space of the recessed portion.

An extreme ultraviolet light generation apparatus according to another aspect of the present disclosure includes a laser device configured to irradiate a droplet with laser light in a plasma generation region, and a chamber device, the chamber device includes a concentrating mirror including a spheroidal reflection surface configured to reflect extreme ultraviolet light generated from plasma in the plasma generation region where the plasma is generated from the droplet to which the laser light is radiated, a central gas supply port configured to supply gas along a focal line passing through a first focal point and a second focal point of the reflection surface from a center side of the reflection surface, an inner wall disposed closest to an optical path of the extreme ultraviolet light in the chamber device, an exhaust port configured to exhaust the gas in the chamber device and disposed on a side lateral to the focal line on the opposite side to concentrating mirror with respect to the plasma generation region when viewed from a direction perpendicular to the focal line, a recessed portion disposed on a side lateral to the focal line and recessed outward from the inner wall when viewed from a direction perpendicular to the focal line, and a lateral gas supply port formed at the recessed portion and configured to supply gas toward the gas supplied from the central gas supply port so that a flow direction of the gas supplied from the central gas supply port is bent from a direction along the focal line toward the exhaust port and an internal space of the recessed portion.

An electronic device manufacturing method according to another aspect of the present disclosure includes generating plasma by irradiating a droplet with laser light using an extreme ultraviolet light generation apparatus, emitting extreme ultraviolet light generated from the plasma to an exposure apparatus, and exposing a photosensitive substrate to the extreme ultraviolet light in the exposure apparatus to produce an electronic device, the extreme ultraviolet light generation apparatus includes a laser device configured to irradiate the droplet with the laser light in a plasma generation region, and a chamber device, the chamber device includes a concentrating mirror including a spheroidal reflection surface configured to reflect extreme ultraviolet light generated from plasma in the plasma generation region where the plasma is generated from the droplet to which the laser light is radiated, a central gas supply port configured to supply gas along a focal line passing through a first focal point and a second focal point of the reflection surface from a center side of the reflection surface, an inner wall disposed closest to an optical path of the extreme ultraviolet light in the chamber device, an exhaust port configured to exhaust the gas in the chamber device and disposed on a side lateral to the focal line on the opposite side to concentrating mirror with respect to the plasma generation region when viewed from a direction perpendicular to the focal line, a recessed portion disposed on a side lateral to the focal line and recessed outward from the inner wall when viewed from a direction perpendicular to the focal line, and a lateral gas supply port formed at the recessed portion and configured to supply gas toward the gas supplied from the central gas supply port so that a flow direction of the gas supplied from the central gas supply port is bent from a direction along the focal line toward the exhaust port and an internal space of the recessed portion.

BRIEF DESCRIPTION OF THE DRAWINGS

Embodiments of the present disclosure will be described below merely as examples with reference to the accompanying drawings.

DESCRIPTION OF EMBODIMENTS

Figure 1:
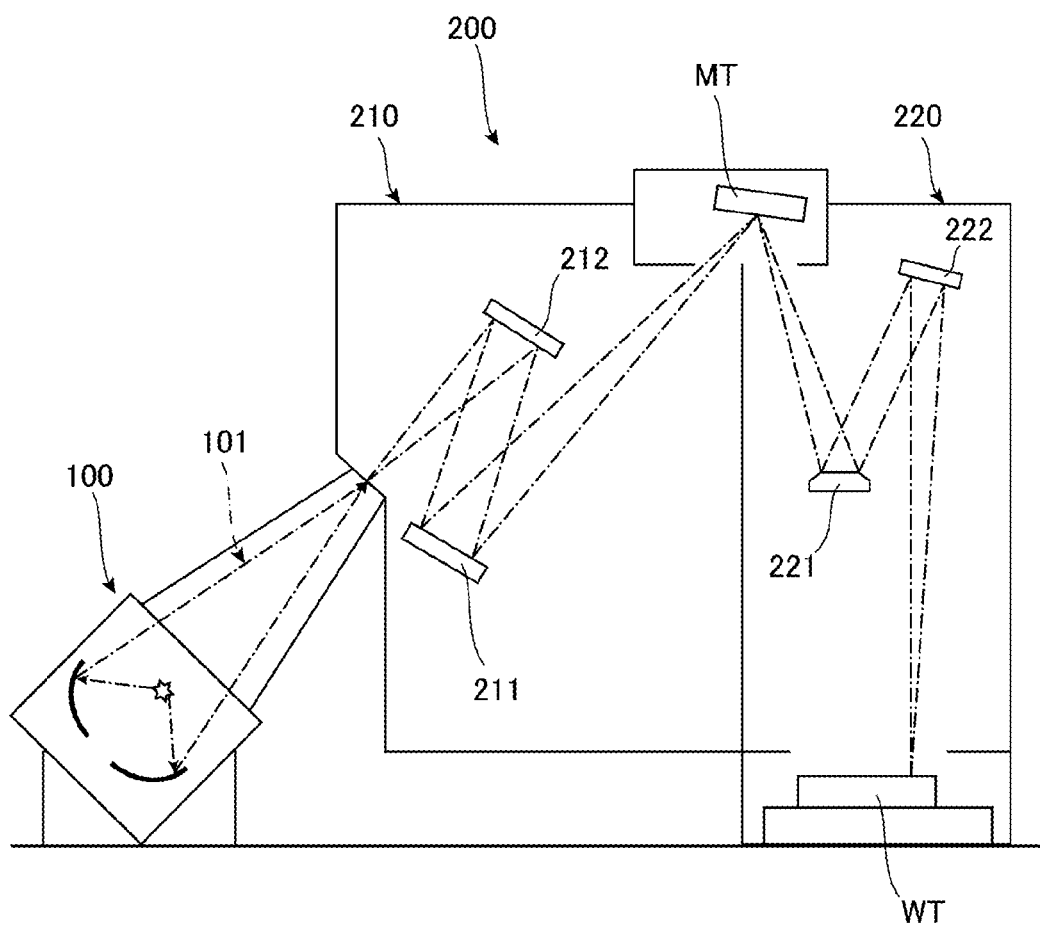
FIG. 1 is a view illustrating an exemplary entire schematic configuration of an electronic device manufacturing apparatus.

1. Overview
2. Description of Electronic Device Manufacturing Apparatus
3. Description of Extreme Ultraviolet Light Generation Apparatus of Comparative Example
   3.1 Configuration
   3.2 Operation
   3.3 Problem
4. Description of EUV Light Generation Apparatus of Embodiment 1
   4.1 Configuration
   4.2 Operation
   4.3 Effect
5. Description of EUV Light Generation Apparatus of Embodiment 2
   5.1 Configuration
   5.2 Effect
6. Description of EUV Light Generation Apparatus of Embodiment 3
   6.1 Configuration
   6.2 Effect
7. Description of EUV Light Generation Apparatus of Embodiment 4
   7.1 Configuration
   7.2 Effect Hereinafter, embodiments of the present disclosure will be described in detail with reference to the drawings.

The embodiments described below illustrate some examples of the present disclosure and do not limit the contents of the present disclosure. Also, all configurations and operation described in the embodiments are not necessarily essential as configurations and operation of the present disclosure. Here, the same components are denoted by the same reference numerals, and duplicate description thereof is omitted.

1. Overview

Embodiments of the present disclosure relate to a chamber device, an extreme ultraviolet light generation apparatus including a chamber device and generating light having a wavelength of extreme ultraviolet (EUV) light, and an electronic device manufacturing apparatus. In the following, extreme ultraviolet light is referred to as EUV light in some cases.

2. Description of Electronic Device Manufacturing Apparatus

As illustrated in FIG. 1, an electronic device manufacturing apparatus includes an EUV light generation apparatus 100 and an exposure apparatus 200. The exposure apparatus 200 includes a mask irradiation unit 210 including a plurality of mirrors 211, 212 and a workpiece irradiation unit 220 including a plurality of mirrors 221, 222. The mask irradiation unit 210 irradiates a mask pattern on a mask table MT through a reflection optical system with EUV light 101 incident from the EUV light generation apparatus 100. The workpiece irradiation unit 220 images the EUV light 101 reflected by the mask table MT onto a workpiece (not illustrated) disposed on the workpiece table WT through a reflection optical system. The workpiece is a photosensitive substrate such as a semiconductor wafer on which photoresist is applied. The exposure apparatus 200 synchronously translates the mask table MT and the workpiece table WT to expose the workpiece to the EUV light 101 reflecting the mask pattern. Through the exposure process as described above, a device pattern is transferred onto the semiconductor wafer, thereby a semiconductor device can be manufactured.

3. Description of Extreme Ultraviolet Light Generation Apparatus of Comparative Example
3.1 Configuration The EUV light generation apparatus 100 of a comparative example will be described. The comparative example of the present disclosure is an example recognized by the applicant as known only by the applicant, and is not a publicly known example admitted by the applicant.

Figure 2:
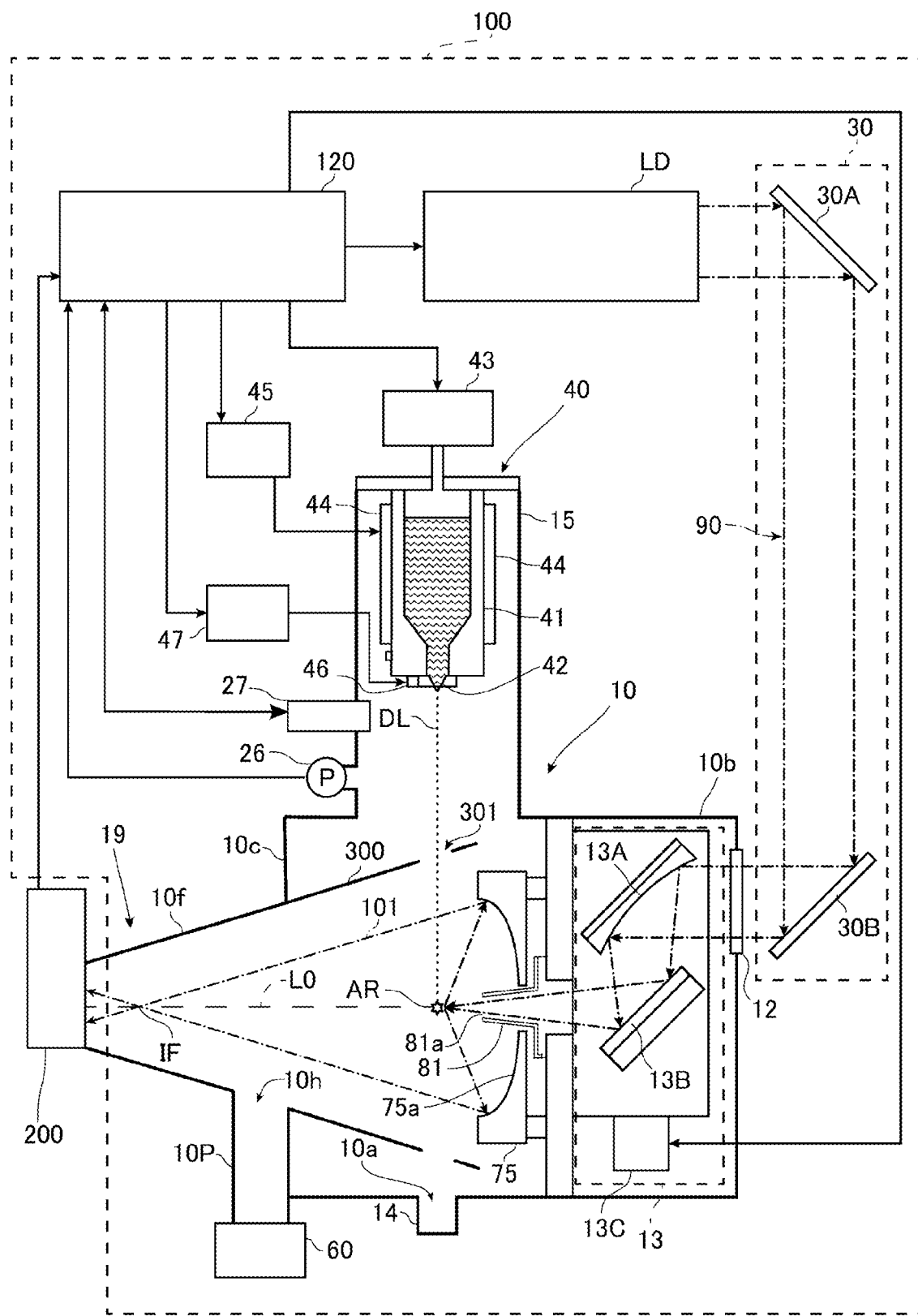
FIG. 2 is a view illustrating an exemplary entire schematic configuration of an extreme ultraviolet light generation apparatus.

FIG. 2 is a view illustrating an exemplary entire schematic configuration of the EUV light generation apparatus 100 of the present example. As illustrated in FIG. 2, the EUV light generation apparatus 100 includes a laser device LD, a chamber device 10, a processor 120, and a laser light delivery optical system 30 as a main configuration. In FIG. 2, some of the configuration of the EUV light generation apparatus 100, such as a gas supply device 74 to be described later, is omitted.

The chamber device 10 is a sealable container. The chamber device 10 includes a wall portion 10b surrounding an internal space having a low pressure atmosphere. The chamber device 10 includes a sub-chamber 15, and a target supply unit 40 is provided in the sub-chamber 15. The target supply unit 40 includes a tank 41 and a nozzle 42. The target supply unit 40 supplies a droplet DL to the internal space of the chamber device 10 and is attached, for example, to penetrate through a wall of the sub-chamber 15. The droplet DL, which is also called a target, is supplied from the target supply unit 40.

The tank 41 stores therein a target substance that becomes the droplet DL. The target substance contains tin. The inside of the tank 41 communicates, through a pipe, with a pressure adjuster 43 adjusting gas pressure. Further, a heater 44 is attached to the tank 41. The heater 44 heats the tank 41 with current applied from a heater power source 45. Through the heating, the target substance in the tank 41 melts. The pressure adjuster 43 and the heater power source 45 are electrically connected to the processor 120.

The nozzle 42 is attached to the tank 41 and discharges the target substance. A piezoelectric element 46 is attached to the nozzle 42. The piezoelectric element 46 is electrically connected to a piezoelectric power source 47 and is driven by voltage applied from the piezoelectric power source 47. The piezoelectric power source 47 is electrically connected to the processor 120. The target substance discharged from the nozzle 42 is formed into the droplet DL through operation of the piezoelectric element 46.

The chamber device 10 also includes a target collection unit 14. The target collection unit 14 is a box body attached to the wall portion 10b of the chamber device 10. The target collection unit 14 communicates with the internal space of the chamber device 10 through an opening 10a formed in the wall portion 10b of the chamber device 10. The target collection unit 14 and the opening 10a are disposed directly below the nozzle 42. The target collection unit 14 is a drain tank to collect any unnecessary droplet DL passing through the opening 10a and reaching the target collection unit 14 and to accumulate the unnecessary droplet DL.

At least one through hole is formed in a first wall portion 10c, which will be described later, of the wall portion 10b of the chamber device 10. The through-hole is blocked by a window 12 through which pulsed laser light 90 emitted from the laser device LD passes.

Further, a laser light concentrating optical system 13 is located in the internal space of the chamber device 10. The laser light concentrating optical system 13 includes a laser light concentrating mirror 13A and a high reflection mirror 13B. The laser light concentrating mirror 13A reflects and concentrates the laser light 90 passing through the window 12. The high reflection mirror 13B reflects light concentrated by the laser light concentrating mirror 13A. Positions of the laser light concentrating mirror 13A and the high reflection mirror 13B are adjusted by a laser light manipulator 13C so that a laser light concentrating position at the internal space of the chamber device 10 coincides with a position specified by the processor 120.

For example, an EUV light concentrating mirror 75 having a spheroidal reflection surface 75a is disposed inside the chamber device 10. The reflection surface 75a reflects EUV light 101 generated from the plasma in the plasma generation region AR. The reflection surface 75a has a first focal point and a second focal point. The reflection surface 75a may be disposed such that, for example, the first focal point is located in the plasma generation region AR and the second focal point is located at an intermediate focal point IF. In FIG. 2, a straight line passing through the first focal point and the second focal point is illustrated as a focal line L0. A through-hole is formed at a center of the EUV light concentrating mirror 75, and the pulsed laser light 90 passes through the through-hole.

Further, the EUV light generation apparatus 100 includes a connection portion 19 providing communication between the internal space of the chamber device 10 and an internal space of the exposure apparatus 200. The connection portion 19 will be described later.

Further, the EUV light generation apparatus 100 includes a pressure sensor 26 and a target sensor 27. The pressure sensor 26 and the target sensor 27 are attached to the chamber device 10 and are electrically connected to the processor 120. The pressure sensor 26 measures pressure in the internal space of the chamber device 10. The target sensor 27 has, for example, an imaging function, and detects the presence, trajectory, position, speed, and the like of the droplet DL according to an instruction from the processor 120.

The laser device LD includes a master oscillator being a light source to perform a burst operation. The master oscillator emits the pulsed laser light 90 in a burst-on duration. The master oscillator is, for example, a laser device configured to emit the laser light 90 by exciting, through electric discharge, gas as mixture of carbon dioxide gas with helium, nitrogen, or the like. Alternatively, the master oscillator may be a quantum cascade laser device. The master oscillator may emit the pulsed laser light 90 by a Q switch system. Further, the master oscillator may include an optical switch, a polarizer, and the like. In the burst operation, the continuous pulsed laser light 90 is emitted at a predetermined repetition frequency in the burst-on duration and the emission of the laser light 90 is stopped in a burst-off duration.

The travel direction of the laser light 90 emitted from the laser device LD is adjusted by the laser light delivery optical system 30. The laser light delivery optical system 30 includes a plurality of mirrors 30A and 30B for adjusting the travel direction of the laser light 90, and a position of at least one of the mirrors 30A and 30B is adjusted by an actuator (not illustrated). Owing to that the position of at least one of the mirrors 30A and 30B is adjusted, the laser light 90 can appropriately propagate to the internal space of the chamber device 10 through the window 12.

The processor 120 controls the entire EUV light generation apparatus 100 and also controls the laser device LD. The processor 120 receives a signal related to the pressure in the internal space of the chamber device 10, which is measured by the pressure sensor 26, a signal related to image data of the droplet DL captured by the target sensor 27, a burst signal from the exposure apparatus 200, and the like. The processor 120 processes the image data and the like, and may control, for example, timing at which the droplet DL is output, an output direction of the droplet DL, and the like. Further, the processor 120 may control oscillation timing of the laser device LD, the travel direction of the laser light 90, the concentrating position of the laser light 90, and the like. Such various kinds of control described above are merely exemplary, and other control may be added as necessary, as described later.

Next, a configuration of the chamber device 10 will be described in more detail.

Figure 3:
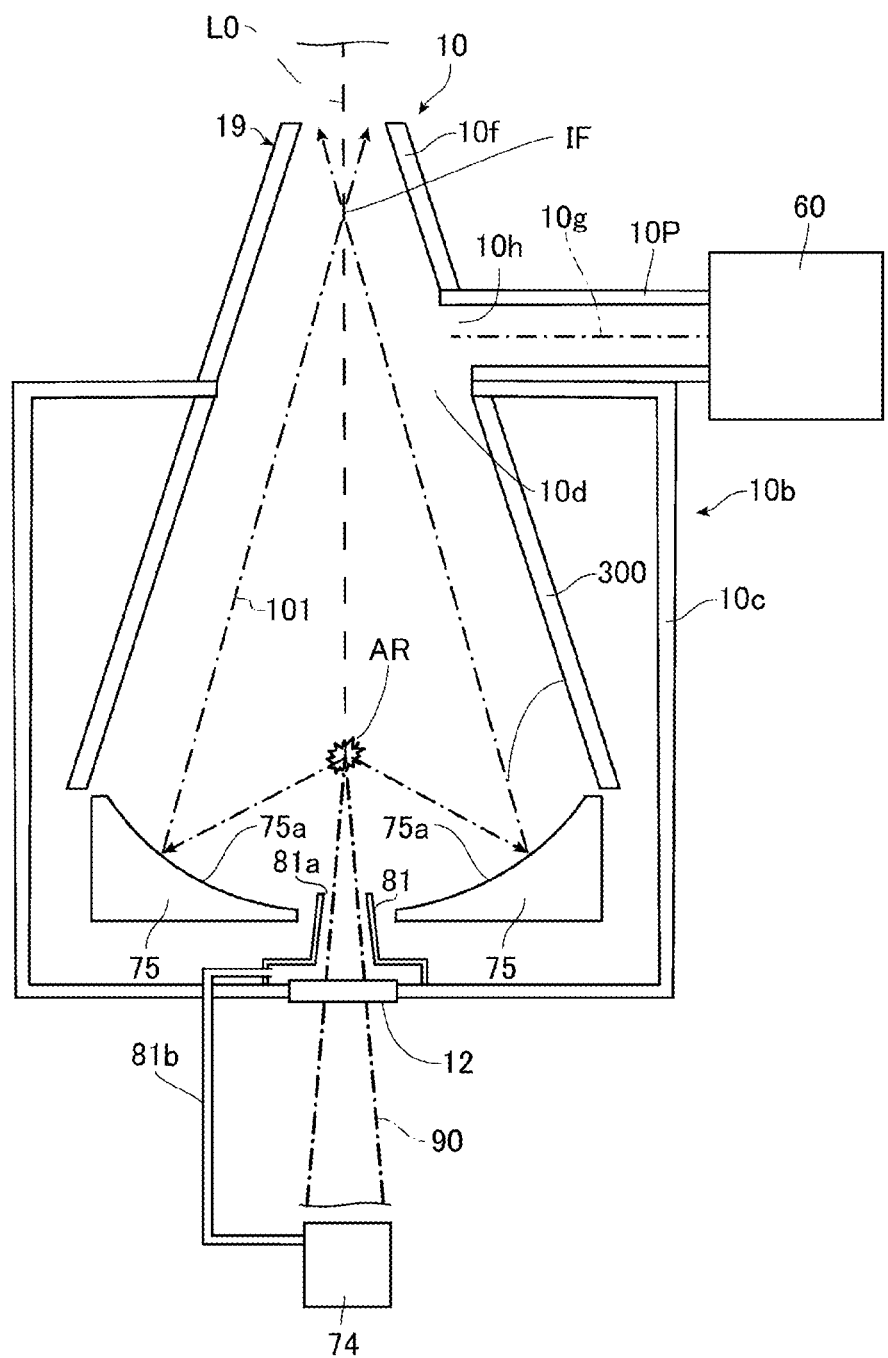
FIG. 3 is a view illustrating an exemplary schematic configuration of a part including a chamber device in a comparative example.

FIG. 3 is a view illustrating an exemplary schematic configuration of a part including the chamber device 10 in the comparative example. In FIG. 3, some of the configuration of the chamber device 10, such as the laser light concentrating optical system 13, the target supply unit 40, and the target collection unit 14 is omitted.

In the comparative example, the wall portion 10b of the chamber device 10 includes the first wall portion 10c being a wall portion on the plasma generation region AR side and a second wall portion 10f that is a wall portion on the exposure apparatus 200 side. The first wall portion 10c and the second wall portion 10f each are a wall of the sealable container, surround the internal space having the low-pressure atmosphere, and communicate with each other. The first wall portion 10c and the second wall portion 10f each are formed of a metal such as aluminum, for example.

The first wall portion 10c has a cylindrical shape with walls provided at both ends. One end of the first wall portion 10c is disposed on the exposure apparatus 200 side, and an opening 10d communicating with an internal space of the second wall portion 10f is formed on an upper wall at the one end. The window 12 is disposed on a bottom wall at the other end of the first wall portion 10c. The first wall portion 10c mainly accommodates the first focal point where the plasma generation region AR is located, the EUV light concentrating mirror 75, a central gas supply unit 81 to be described later, and a heat shield 300 to be described later, and is disposed on the side lateral to the first focal point, the EUV light concentrating mirror 75, the central gas supply unit 81, and the heat shield 300. Although not illustrated in FIG. 3, the opening 10a is formed in the first wall portion 10c, and the first wall portion 10c is continuous with the sub-chamber 15.

The central gas supply unit 81 supplies etching gas to the internal space of the chamber device 10. The internal space of the chamber device 10 corresponds to the internal space of the first wall portion 10c and the internal space of the second wall portion 10f that communicates with the first wall portion 10c through the opening 10d of the first wall portion 10c. As described above, since the target substance contains tin, the etching gas is, for example, hydrogen-containing gas having a hydrogen gas concentration of 100% in effect. Alternatively, the etching gas may be, for example, a balance gas having a hydrogen gas concentration of about 3%. The balance gas contains nitrogen ($N_2$) gas and argon (Ar) gas. Tin fine particles and tin charged particles are generated when the target substance forming the droplet DL is turned into plasma in the plasma generation region AR by being irradiated with the laser light 90. The etching gas contains hydrogen that reacts with tin constituting the fine particles and charged particles. Through the reaction with hydrogen, tin becomes stannane ($SnH_4$) gas at room temperature.

The central gas supply unit 81 has a shape of a side surface of a circular truncated cone and is called a cone in some cases. The central gas supply unit 81 is inserted through the through hole formed in the center of the EUV light concentrating mirror 75. The central gas supply unit 81 has a central gas supply port 81a being a nozzle. The central gas supply port 81a supplies the etching gas from the center side of the reflection surface 75a toward the plasma generation region AR. The central gas supply port 81a preferably supplies the etching gas in the direction away from the reflection surface 75a from the center side of the reflection surface 75a along the focal line L0 passing through the first focal point and the second focal point of the reflection surface 75a. The focal line L0 is extended along the center axis direction of the reflection surface 75a. The focal line L0 passes through the center of the opening 10d of the first wall portion 10c. The central gas supply port 81a is connected to the gas supply device 74 being a tank for supplying the etching gas through a pipe 81b of the central gas supply unit 81. The gas supply device 74 is driven and controlled by the processor 120. A supply gas flow rate adjusting unit (not illustrated) may be provided in the pipe 81b. The laser light 90 passes through the through hole of the EUV light concentrating mirror 75 through the window 12 provided on the first wall portion 10c and the central gas supply unit 81, as described above.

A heat shield 300 is disposed between the first wall portion 10c and the plasma generation region AR. No member is disposed between the heat shield 300 and the plasma generation region AR, and it can be understood that the heat shield 300 is an inner wall located closest to the plasma generation region AR in the chamber device 10 and adjacent to the plasma generation region AR.

The heat shield 300 is, for example, cylindrical and surrounds the plasma generation region AR. The heat shield 300 has a shape of, for example, a side surface of a circular truncated cone, and one end of the heat shield 300, being on an upper surface side of the truncated cone, is disposed on the second wall portion 10f side, and the other end of the heat shield 300, which is a bottom surface side of the truncated cone, is disposed on the EUV light concentrating mirror 75 side. The one end of the heat shield 300 is disposed in contact with the first wall portion 10c around a peripheral edge of the opening 10d, and the other end of the heat shield 300 is disposed around the peripheral portion of the reflection surface 75a of the EUV light concentrating mirror 75.

The heat shield 300 is formed of, for example, a metal such as aluminum. The heat shield 300 is directly irradiated with light generated from the plasma generated by irradiation of the droplet DL with the laser light 90. The heat shield 300 is irradiated with light instead of the first wall portion 10c of the chamber device 10, thereby suppressing thermal deformation of the first wall portion 10c of the chamber device 10 due to light. The light includes, for example, at least one of emitted light incidentally emitted from the plasma along with generation of the plasma, and scattered light being the laser light 90 that is scattered by the target substance. The light may include EUV light.

The heat shield 300 is fixed to the first wall portion 10c of the chamber device 10 through a damper (not illustrated). The damper is made of a material in which stress of expansion and deformation of the heat shield 300 due to heat is less likely to be transmitted to the first wall portion 10c of the chamber device 10.

The heat shield 300 is further provided with a flow path portion (not illustrated). The flow path portion is formed of a hole formed in the wall portion of the heat shield 300. A cooling medium flows inside the flow path portion. The cooling medium suppresses thermal deformation of the heat shield 300 due to the above-describe light including at least one of emitted light and scattered light. For example, the cooling medium is water and temperature of the water is 5° C.

As illustrated in FIG. 2, a pair of passage holes 301 disposed on a travel path of the droplet DL is formed at the heat shield 300. The droplet DL passes through the passage holes 301. The passage holes 301 are not illustrated in FIG. 3.

Returning to FIG. 3, the second wall portion 10f will be described.

The second wall portion 10f has a shape of a side surface of a circular truncated cone, and one end of the second wall portion 10f, being on an upper surface side of the truncated cone, is disposed on the exposure apparatus 200 side, and the other end portion of the second wall portion 10f, being on a bottom surface side of the truncated cone, is in contact with the first wall portion 10c. The one end of the second wall portion 10f is the connection portion 19 described above, and the internal space of the second wall portion 10f communicates with the internal space of the exposure apparatus 200 through the opening at the one end of the second wall portion 10f. The opening at the one end of the second wall portion 10f is an emission port of the EUV light 101 in the EUV light generation apparatus 100. The internal space of the second wall portion 10f communicates with the internal space of the first wall portion 10c through the opening 10d of the first wall portion 10c at the other end of the second wall portion 10f. The second wall portion 10f mainly accommodates the second focal point at which the intermediate focal point IF is located, is disposed on the side lateral to the second focal point, and is sometimes referred to as an IF cap. The center axis of the second wall portion 10f is located on the focal line L0.

An inner circumferential surface of the second wall portion 10f is disposed at the same inclination as an inner circumferential surface of the heat shield 300 with respect to the focal line L0 so that the inner circumferential surface of the second wall portion 10f and the inner circumferential surface of the heat shield 300 are disposed on the same plane. The second wall portion 10f and the heat shield 300 are disposed closest to the optical path of the EUV light 101 generated from the plasma generated by the irradiation of the droplet DL with the laser light 90. No member is disposed between the second wall portion 10f and the optical path of the EUV light 101 and between the heat shield 300 and the optical path of the EUV light 101, and it can be understood that the second wall portion 10f and the heat shield 300 are inner walls located closest to the optical path of the EUV light 101 in the chamber device 10 and adjacent to the optical path. Further, the second wall portion 10f and the heat shield 300 are disposed to surround the optical path of the EUV light 101. The optical path of the EUV light 101 is, for example, a path of the EUV light 101 traveling from the plasma generation region AR to the exposure apparatus 200 side.

An exhaust port 10h is formed in the second wall portion 10f. In the direction along the focal line L0, the exhaust port 10h is formed on the side opposite to the reflection surface 75a with respect to the plasma generation region AR. Since the exposure apparatus 200 is disposed on the focal line L0, the exhaust port 10h is disposed not on the focal line L0 but on the side lateral to the focal line L0. The direction along the center axis 10g of the exhaust port 10h is perpendicular to the focal line L0. The exhaust port 10h exhausts residual gas to be described later in the internal space of the chamber device 10. The exhaust port 10h is connected to an exhaust pipe 10P, and the exhaust pipe 10P is connected to an exhaust pump 60.

When the target substance is converted into plasma, the residual gas as exhaust gas is generated in the internal space of the chamber device 10. The residual gas contains tin fine particles and tin charged particles generated through the plasma generation from the target substance, stannane generated through the reaction of the tin fine particles and charged particles with the etching gas, and unreacted etching gas. Some of the charged particles are neutralized in the internal space of the chamber device 10, and the residual gas contains the neutralized charged particles as well. The exhaust pump 60 sucks the residual gas through the exhaust port 10h and the exhaust pipe 10p.

3.2 Operation

Next, operation of the EUV light generation apparatus 100 of the comparative example will be described. In the EUV light generation apparatus 100, for example, at the time of new installation or maintenance or the like, atmospheric air in the internal space of the chamber device 10 is exhausted. At this time, purging and exhausting of the internal space of the chamber device 10 may be repeated for exhausting the atmospheric components. For example, inert gas such as nitrogen ($N_2$) or argon (Ar) is preferably used for the purge gas. Thereafter, when the pressure of the internal space of the chamber device 10 is equal to or less than a predetermined pressure, the processor 120 starts introduction of the etching gas from the gas supply device 74 to the internal space of the chamber device 10 through the central gas supply unit 81. At this time, the processor 120 may control a supply gas flow rate adjusting unit (not illustrated) and the exhaust pump 60 so that the pressure in the internal space of the chamber device 10 is maintained at a predetermined pressure. Thereafter, the processor 120 waits until a predetermined time elapses from the start of introduction of the etching gas.

Further, the processor 120 causes the gas in the internal space of the chamber device 10 to be exhausted from the exhaust port 10h by the exhaust pump 60, and keeps the pressure in the internal space of the chamber device 10 substantially constant based on the signal of the pressure in the internal space of the chamber device 10 measured by the pressure sensor 26.

In order to heat and maintain the target substance in the tank 41 at a predetermined temperature equal to or higher than the melting point, the processor 120 causes the heater power source 45 to apply current to the heater 44 to increase temperature of the heater 44. In this case, the processor 120 controls temperature of the target substance to the predetermined temperature by adjusting a value of the current applied from the heater power source 45 to the heater 44 based on an output from a temperature sensor (not illustrated). The predetermined temperature is, for example, 250° C. to 290° C. when the target substance is tin.

Further, the processor 120 causes the pressure adjuster 43 to adjust the pressure in the tank 41 so that the melted target substance is discharged through the hole of the nozzle 42 at a predetermined speed. The target substance discharged through the hole of the nozzle 42 may be in the form of jet. At this time, the processor 120 causes the piezoelectric power source 47 to apply a voltage having a predetermined waveform to the piezoelectric element 46 to generate the droplet DL. Vibration of the piezoelectric element 46 can propagate through the nozzle 42 to the target substance to be discharged through the hole of the nozzle 42. The target substance is divided at a predetermined cycle by the vibration, and a liquid droplet DL is generated from the target substance.

Further, the processor 120 outputs a light emission trigger signal to the laser device LD. When the light emission trigger signal is input, the laser device LD emits the pulsed laser light 90. The emitted laser light 90 is incident on the laser light concentrating optical system 13 through the laser light delivery optical system 30 and the window 12. At this time, the processor 120 controls the laser light manipulator 13C of the laser light concentrating optical system 13 such that the laser light 90 is concentrated in the plasma generation region AR. The processor 120 causes the laser device LD to emit the laser light 90 based on the signal from the target sensor 27 so that the droplet DL is irradiated with the laser light 90. Thus, the droplet DL is irradiated in the plasma generation region AR with the laser light 90 concentrated by the laser light concentrating mirror 13A. Light including EUV light is emitted from the plasma generated through the irradiation.

Among the light including the EUV light generated in the plasma generation region AR, the EUV light 101 is concentrated at the intermediate focal point IF by the EUV light concentrating mirror 75, and then is incident on the exposure apparatus 200 through the opening of the second wall portion 10f.

When the target substance is turned into plasma, tin fine particles are generated as described above. The fine particles diffuse into the internal space of the chamber device 10. Some of the fine particles diffused into the internal space of the chamber device 10 may adhere to the reflection surface 75a. The fine particles adhering to the reflection surface 75a and the fine particles diffusing into the internal space of the chamber device 10 react with the hydrogen-containing etching gas supplied from the central gas supply unit 81 to become stannane. Most of the stannane obtained through the reaction with the etching gas flows into the exhaust port 10h along with the flow of the unreacted etching gas as described later.

Further, at least some of the fine particles not adhering to the reflection surface 75a may become stannane through reaction with some of the unreacted etching gas flowing in the internal space of the chamber device 10. Most of the stannane generated through the reaction flows into the exhaust port 10h along with the flow of the unreacted etching gas. At least some of the unreacted charged particles, fine particles, and etching gas flow into the exhaust port 10h as described later.

The unreacted etching gas, fine particles, charged particles, stannane, and the like having flowed into the exhaust port 10h flow as residual gas through the exhaust pipe 10p into the exhaust pump 60 and are subjected to predetermined exhaust treatment such as detoxification.

In this comparative example, the processor 120 starts introduction of the etching gas from the gas supply device 74 to the internal space of the chamber device 10 through the central gas supply unit 81.

Figure 4:
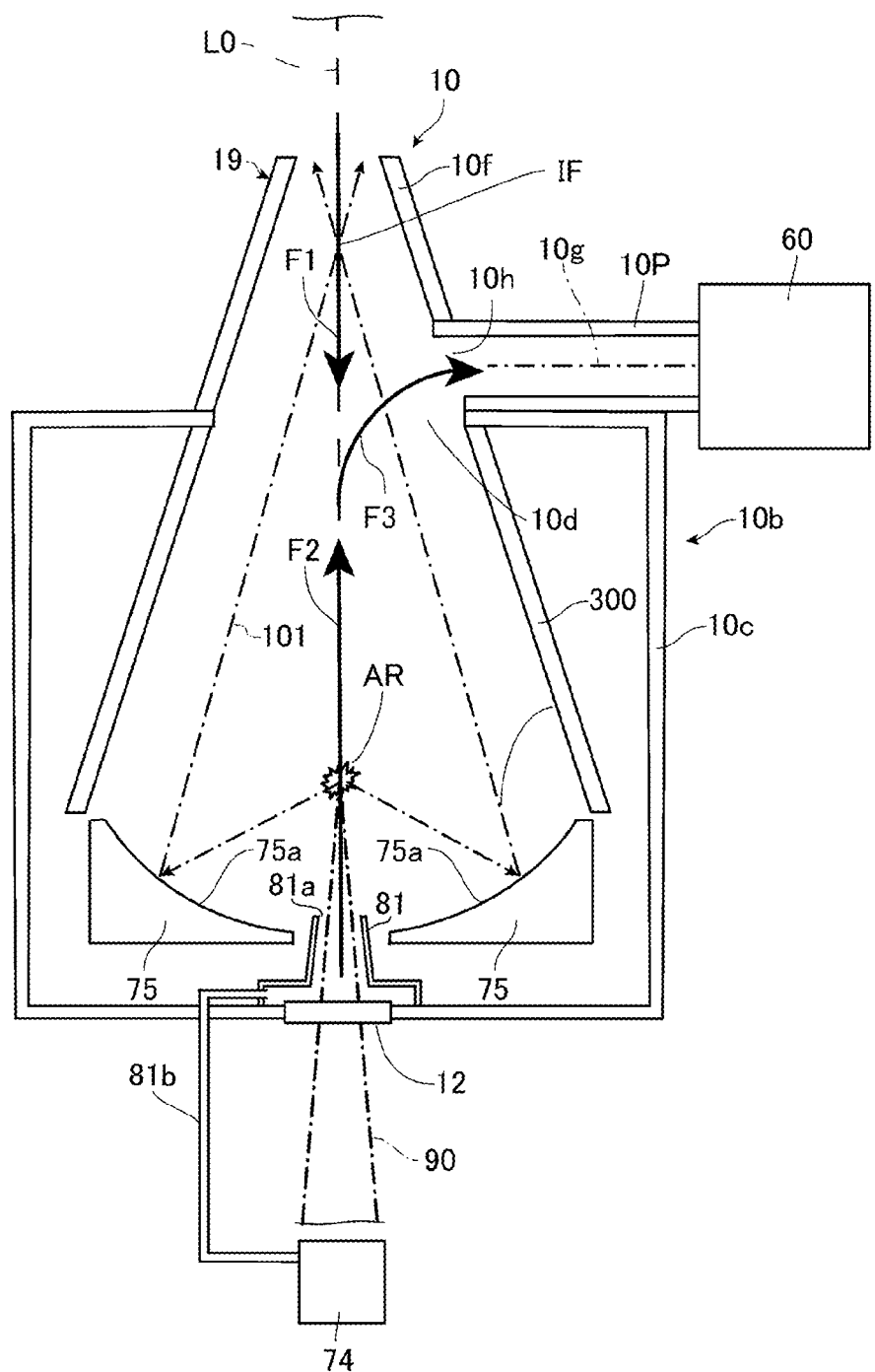
FIG. 4 is a view illustrating flow of etching gas from an exposure apparatus, flow of the etching gas from a central gas supply port, and flow of the etching gas traveling to an exhaust port in the comparative example.

When the central gas supply unit 81 supplies the etching gas, the exposure apparatus 200 supplies the etching gas from the exposure apparatus 200 toward the internal space of the first wall portion 10c through the internal space of the second wall portion 10f. The etching gas from the exposure apparatus 200 is substantially the same gas as the etching gas from the central gas supply unit 81, and is, for example, hydrogen-containing gas, the concentration of which may be considered to be 100%. Alternatively, the etching gas from the exposure apparatus 200 may be, for example, a balance gas having a hydrogen gas concentration of about 3%. FIG. 4 is a view illustrating flow of the etching gas from the exposure apparatus 200, flow of the etching gas from the central gas supply port 81a, and flow of the etching gas traveling to the exhaust port 10h. In FIG. 4, the flow of the etching gas from the exposure apparatus 200 is indicated by a solid arrow F1. The etching gas from the exposure apparatus 200 suppresses traveling of the residual gas to the exposure apparatus 200 and suppresses adhesion of tin to the inner circumferential surface of the second wall portion 10f. Tin may be precipitated from the residual gas as described later.

In the central gas supply unit 81, the etching gas is supplied from the gas supply device 74 to the central gas supply port 81a through the pipe 81b, and is supplied from the central gas supply port 81a to the internal space of the chamber device 10. The supplied etching gas flows in the direction away from the reflection surface 75a along the focal line L0. In FIG. 4, the flow of the etching gas flowing in the direction away from the reflection surface 75a along the focal line L0 is indicated by a solid arrow F2. The flowing etching gas collides with the etching gas from the exposure apparatus 200. Due to the collision, in some cases, the direction of the flow of the etching gas from the central gas supply port 81a is bent from the direction along the focal line L0 toward the exhaust port 10h. In this case, for example, the flow rate of the etching gas from the central gas supply port 81a may be set to 30 slm or less, and the flow rate of the etching gas from the exposure apparatus 200 may be set to 10 slm. In FIG. 4, the flow of the etching gas bent from the direction along the focal line L0 toward the exhaust port 10h is indicated by a solid arrow F3. Accordingly, the etching gas from the central gas supply port 81a flows toward the exhaust port 10h together with the etching gas from the exposure apparatus 200 and the residual gas in the internal space of the chamber device 10, and is sucked from the exhaust port 10h to the exhaust pump 60 through the exhaust pipe 10p.

Since the residual gas is sucked by the exhaust pump 60 together with the etching gas from the central gas supply port 81a, generation of tin from the residual gas is suppressed. In the internal space of the chamber device 10, tin may be precipitated from the residual gas heated by the light generated from the plasma. Specifically, some of the stannane contained in the residual gas may be returned to tin through heating. If tin is precipitated from the residual gas in the internal space of the chamber device 10 and the tin adheres to the reflection surface 75a, the reflectivity of the reflection surface 75a is reduced, and concentration of the EUV light 101 toward the intermediate focal point IF by the reflection surface 75a may be obstructed by the tin. However, as described above, since the residual gas is sucked by the exhaust pump 60 together with the etching gas from the central gas supply port 81a, generation of tin from the residual gas is suppressed, and adhesion of tin to the reflection surface 75a is suppressed. Therefore, obstruction of light concentration by tin is suppressed, and the EUV light 101 is concentrated on the intermediate focal point IF.

When plasma is generated in the plasma generation region AR by irradiating the droplet DL with the laser light 90, light other than EUV light is generated from the plasma as well. The light includes, for example, at least one of emitted light and scattered light. The heat shield 300 is irradiated with the light. Accordingly, since the irradiation of the first wall portion 10c of the chamber device 10 with light is suppressed, thermal deformation of the first wall portion 10c of the chamber device 10 due to light is suppressed. Further, the heat shield 300 is cooled by the cooling medium flowing through the flow path portion, and the thermal deformation of the heat shield 300 due to light is suppressed by the cooling medium.

Here, when the tin generated from the residual gas adheres to the inner circumferential surface of the heat shield 300, the heat shield 300 can be thermally deformed due to light radiated to the tin. However, as described above, the residual gas is fed toward the exhaust pump 60 through the exhaust port 10h. Therefore, generation of tin from the residual gas is suppressed, adhesion of tin to the heat shield 300 is suppressed, and the thermal deformation of the heat shield 300 can be suppressed. Further, when the adhering tin falls from the inner circumferential surface of the heat shield 300, a structural element of the internal space of the chamber device 10 such as the reflection surface 75a may be contaminated by the falling tin. Such contamination of the structural element of the internal space of the chamber device 10 may cause failure of the chamber device 10. However, as described above, the residual gas flows toward the exhaust port 10h together with the etching gas, and is sucked from the exhaust port 10h to the exhaust pump 60 through the exhaust pipe 10P together with the etching gas. Therefore, generation of tin can be suppressed, adhesion of tin to the heat shield 300 can be suppressed, and failure of the chamber device 10 can be suppressed.

3.3 Problem

Figure 5:
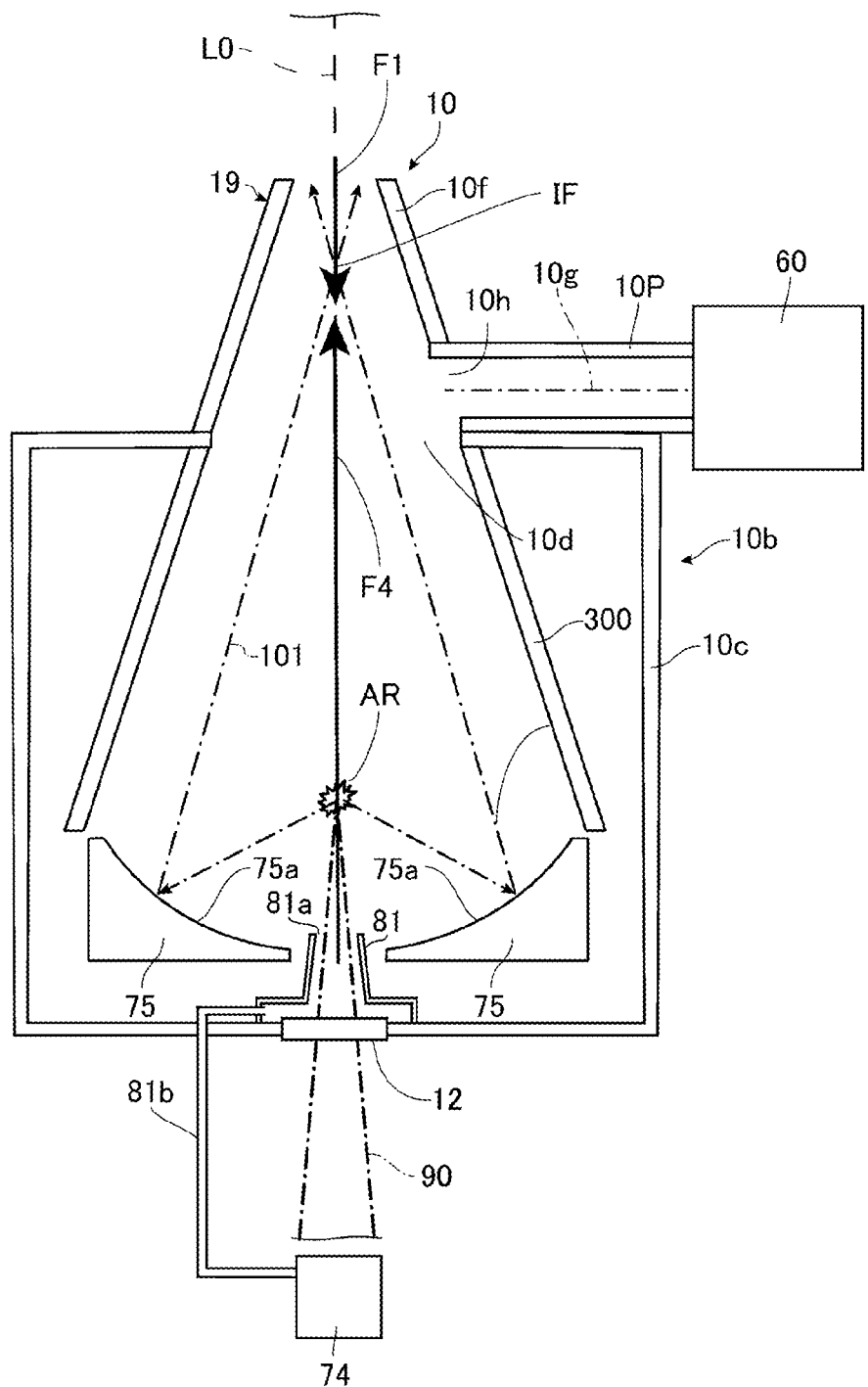
FIG. 5 is a view illustrating flow of the etching gas from the exposure apparatus and flow of the etching gas from the central gas supply port in the case where the direction of flow of the etching gas from the central gas supply port is not easily bent toward the exhaust port in the comparative example.

Even when the etching gas from the central gas supply port 81a collides with the etching gas from the exposure apparatus 200, in some cases, the direction of the flow of the etching gas from the central gas supply port 81a is not easily bent from the direction along the focal line L0 toward the exhaust port 10h. As such a case, for example, in order to further suppress adhesion of tin to the reflection surface 75a, the flow rate of the etching gas from the central gas supply port 81a may be increased to 50 slm to 100 slm while the flow rate of the etching gas from the exposure apparatus 200 is maintained at 10 slm. When the direction of the flow of the etching gas from the central gas supply port 81a is difficult to be bent toward the exhaust port 10h, the etching gas is difficult to flow to the exhaust port 10h, pushes back the etching gas from the exposure apparatus 200, and sometimes passes over the exhaust port 10h toward the exposure apparatus 200. FIG. 5 is a view illustrating flow of the etching gas from the exposure apparatus 200 and flow of the etching gas from the central gas supply port 81a in the case where the direction of the flow of the etching gas from the central gas supply port 81a is not easily bent toward the exhaust port 10h. In FIG. 5, the flow of the etching gas from the central gas supply port 81a passing over the exhaust port 10h toward the exposure apparatus 200 is indicated by a solid arrow F4. When the etching gas passes over the exhaust port 10h toward the exposure apparatus 200, the residual gas having a high density of tin also flows toward the internal space of the second wall portion 10f on the exposure apparatus 200 side together with the etching gas, and the residual gas having high density of tin stays in the internal space of the second wall portion 10f on the exposure apparatus 200 side. Accordingly, tin is precipitated from the residual gas, tin adheres to the inner circumferential surface of the second wall portion 10f, and the inner circumferential surface of the second wall portion 10f may be contaminated by tin. When tin adheres to the inner circumferential surface of the second wall portion 10f, traveling of the EUV light 101 to the exposure apparatus 200 may be obstructed. Further, when tin falls from the inner circumferential surface of the second wall portion 10f, a structural element of the internal space of the chamber device 10 such as the reflection surface 75a may be contaminated by the falling tin. Such contamination of the structural element of the internal space of the chamber device 10 may cause failure of the chamber device 10.

Further, when it is difficult for the etching gas from the central gas supply port 81a to flow to the exhaust port 10h together with the residual gas, the residual gas stays in the internal space of the first wall portion 10c. Owing to precipitation of tin from the staying residual gas, the inner circumferential surface of the heat shield 300 may be contaminated by tin. When tin adheres to the inner circumferential surface of the heat shield 300, traveling of the EUV light 101 to the exposure apparatus 200 may be obstructed. Further, when tin falls from the inner circumferential surface of the heat shield 300, a structural element of the internal space of the chamber device 10 such as the reflection surface 75a may be contaminated by the falling tin. Such contamination of the structural element of the internal space of the chamber device 10 may cause failure of the chamber device 10.

Thus, when the etching gas from the central gas supply port 81a is difficult to flow to the exhaust port 10h together with the residual gas, tin adheres to the second wall portion 10f and the heat shield 300, which are inner walls disposed closest to the optical path of the EUV light 101, and adhesion of tin may cause failure in the chamber device 10.

Therefore, in the following embodiments, the chamber device 10 is exemplified in which the etching gas is supplied from a lateral gas supply port 85a formed in a recessed portion 83 to the internal space of the chamber device 10, thereby suppressing failure of the chamber device 10 caused by the etching gas which is difficult to flow to the exhaust port 10h.

4. Description of EUV Light Generation Apparatus of Embodiment 1

Next, a configuration of the EUV light generation apparatus 100 of Embodiment 1 will be described. Any component same as that described above is denoted by an identical reference sign, and duplicate description thereof is omitted unless specific description is needed.

4.1 Configuration

Figure 6:
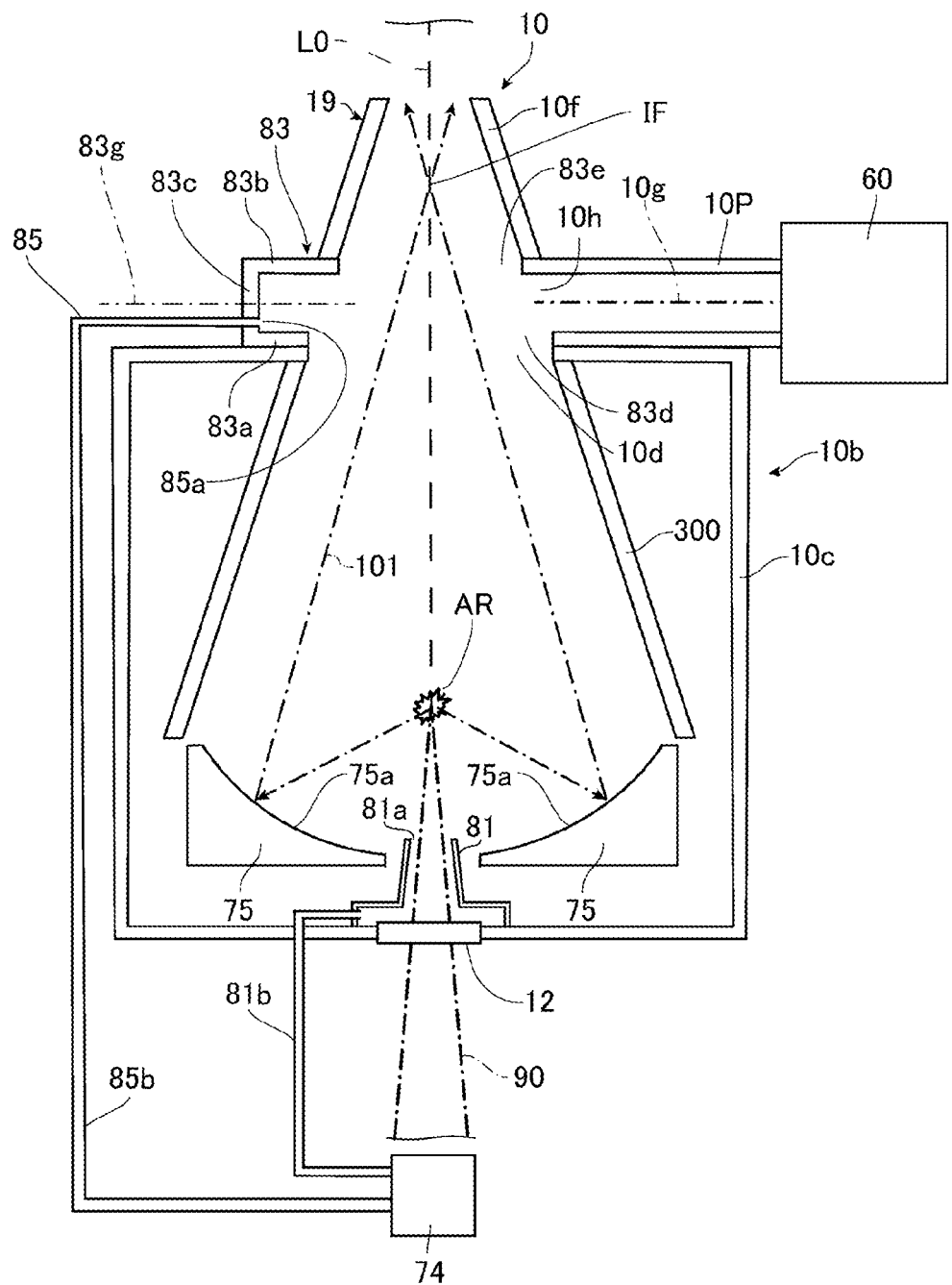
FIG. 6 is a view illustrating an exemplary schematic configuration of a part including the chamber device in Embodiment 1.

FIG. 6 is a view illustrating an exemplary schematic configuration of a part including the chamber device 10 in the present embodiment. In FIG. 6, similarly to FIG. 3, some of the configuration of the chamber device 10, such as the laser light concentrating optical system 13, the target supply unit 40, and the target collection unit 14 is omitted.

In the present embodiment, the chamber device 10 further includes the recessed portion 83. The recessed portion 83 is formed of, for example, a metal such as aluminum.

The recessed portion 83 is disposed between the first wall portion 10c and the second wall portion 10f in the direction along the focal line L0, and is in contact with the first wall portion 10c and the second wall portion 10f.

The recessed portion 83 is disposed on the side lateral to the focal line L0 when viewed from the direction perpendicular to the focal line L0, and is recessed outward from the second wall portion 10f and the heat shield 300, which are inner walls disposed closest to the optical path of the EUV light 101. Here, "outward" represents the direction away from the focal line L0 in the direction perpendicular to the focal line L0. The recessed portion 83 includes a bottom wall 83a, a top wall 83b facing the bottom wall 83a, and a side wall 83c continuous to the bottom wall 83a and the top wall 83b. The bottom wall 83a and the top wall 83b are disposed along the direction substantially perpendicular to the direction along the focal line L0. The side wall 83c is disposed along the direction substantially along the focal line L0. A first opening 83d communicating with the internal space of the first wall portion 10c through the opening 10d of the first wall portion 10c is formed at the bottom wall 83a. A second opening 83e communicating with the internal space of the second wall portion 10f if formed at the top wall 83b. The center of the first opening 83d and the center of the second opening 83e are located on the focal line L0. The diameter of the first opening 83d is larger than the diameter of the second opening 83e, and is substantially the same as the diameter of the opening 10d and the minimum inner diameter of the heat shield 300. Therefore, when the second wall portion 10f side is viewed from the inside of the heat shield 300 along the focal line L0 through the opening 10d, the first opening 83d, and the second opening 83e, the recessed portion 83 is recessed so that the bottom wall 83a of the recessed portion 83 is not directly viewed due to the inner circumferential surface of the heat shield 300. The diameter of the first opening 83d and the diameter of the second opening 83e are larger than the diameter of the central gas supply port 81a. The etching gas from the central gas supply port 81a passes through the first opening 83d and flows toward the internal space of the recessed portion 83. The etching gas from the exposure apparatus 200 passes through the second opening 83e and flows toward the internal space of the recessed portion 83.

The height of the recessed portion 83 in the direction along the focal line L0 represents the length between the bottom wall 83a and the top wall 83b, and is, for example, 100 to 150 mm. The depth of the recessed portion 83 perpendicular to the focal line L0 represents the length between a peripheral edge of the first opening 83d and the side wall 83c along the center axis 83g of the recessed portion 83, and is, for example, 50 to 100 mm. The center axis 83g is an axis passing through the center in the direction along the focal line L0 between the bottom wall 83a and the top wall 83b, and is extended perpendicular to the focal line L0.

Figure 7:
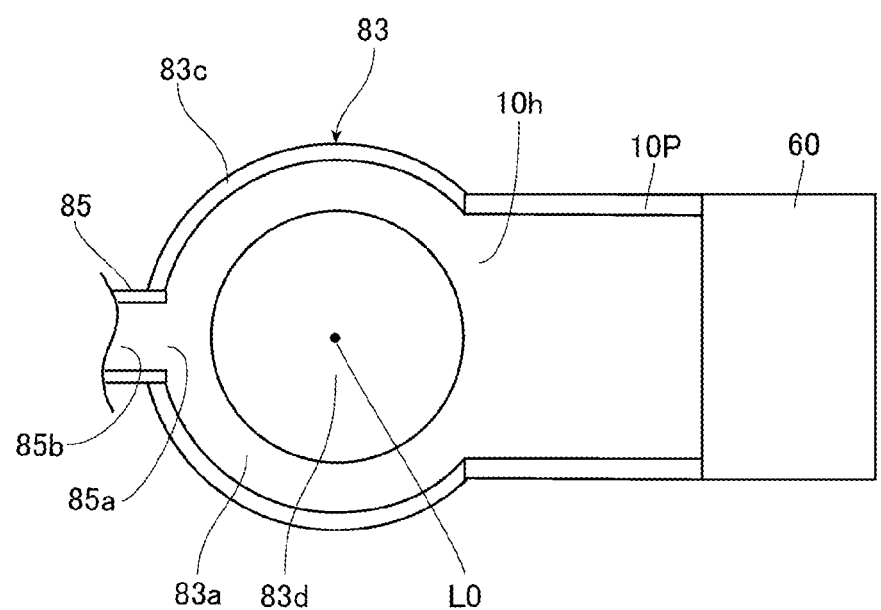
FIG. 7 is a view of a configuration of a recessed portion according to Embodiment 1 as viewed along a focal line.

FIG. 7 is a view of the configuration of the recessed portion 83 according to the present embodiment as viewed along the focal line L0. When viewed from the direction along the focal line L0, the side wall 83c of the recessed portion 83 is substantially C-shaped and is provided on the circumference of the same circle with reference to the focal line L0. The exhaust port 10h is formed at a cutout of the side wall 83c. Accordingly, the recessed portion 83 is provided on the same plane as the exhaust port 10h. Similarly to the comparative example, in the direction along the focal line L0, the exhaust port 10h is formed on the side opposite to the reflection surface 75a with respect to the plasma generation region AR. Since the exposure apparatus 200 is disposed on the focal line L0, the exhaust port 10h is disposed not on the focal line L0 but on the side lateral to the focal line L0. The direction along the center axis 10g of the exhaust port 10h is perpendicular to the focal line L0.

In the present embodiment, as illustrated in FIG. 6, the chamber device 10 further includes the lateral gas supply unit 85. The lateral gas supply unit 85 includes the lateral gas supply port 85a being a nozzle. The lateral gas supply port 85a is connected to the gas supply device 74 through a pipe 85b of the lateral gas supply unit 85. A supply gas flow rate adjusting unit (not illustrated) may be provided at the pipe 85b.

The lateral gas supply port 85a is formed on the inner circumferential surface of the side wall 83c of the recessed portion 83. The lateral gas supply port 85a is formed to face the exhaust port 10h. Therefore, the lateral gas supply port 85a is formed on the opposite side to the exhaust port 10h with reference to the focal line L0. The lateral gas supply port 85a is formed on the EUV light concentrating mirror 75 side located below the center axis 83g of the recessed portion 83. Accordingly, the lateral gas supply port 85a is formed between the center axis 83g of the recessed portion 83 and the EUV light concentrating mirror 75. As illustrated in FIG. 7, when viewed from the direction along the focal line L0, the lateral gas supply port 85a is smaller than the exhaust port 10h. Further, the width of the lateral gas supply port 85a perpendicular to the focal line L0 is smaller than the diameter of the first opening 83d.

Figure 8:
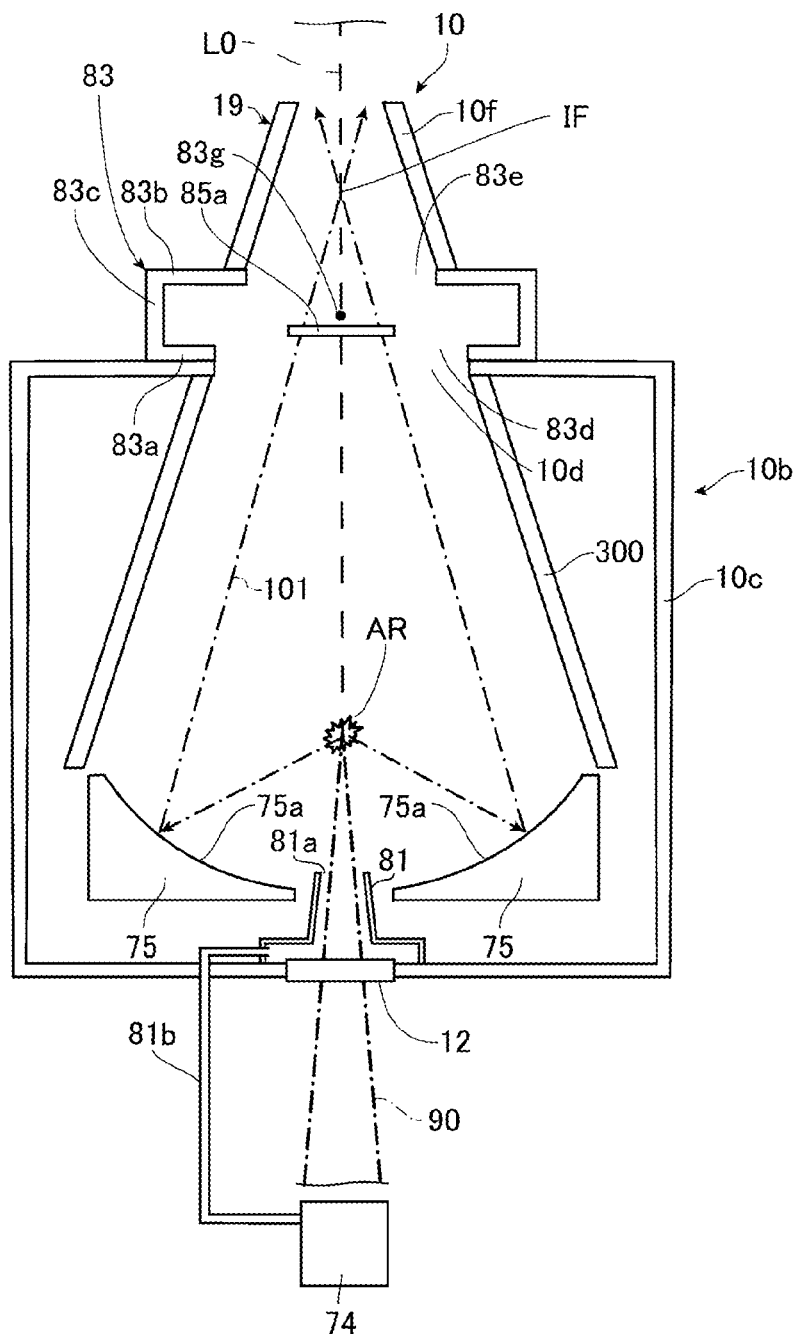
FIG. 8 is a view illustrating an exemplary schematic configuration of a part including the chamber device when a lateral gas supply port is viewed from the exhaust port in Embodiment 1.

FIG. 8 is a view illustrating an exemplary schematic configuration of a part including the chamber device 10 when the lateral gas supply port 85a is viewed from the exhaust port 10h. When the lateral gas supply port 85a is viewed from the front, the lateral gas supply port 85a has, for example, a rectangular shape. In the direction along the focal line L0, the lateral gas supply port 85a is formed at a position overlapping with the first opening 83d.

The lateral gas supply port 85a supplies the etching gas toward the etching gas from the central gas supply port 81a so that the etching gas from the lateral gas supply port 85a collides with the etching gas from the central gas supply port 81a. Further, the lateral gas supply port 85a supplies the etching gas toward the etching gas from the central gas supply port 81a so that the direction of the flow of some part of the etching gas from the central gas supply port 81a is bent from the direction along the focal line L0 toward the exhaust port 10h due to the collision, and the direction of the flow of some other part of the etching gas is bent from the direction along the focal line L0 toward the internal space of the recessed portion 83. The lateral gas supply port 85a supplies the etching gas toward the exhaust port 10h so that the etching gas from the lateral gas supply port 85a passes through the focal line L0 and flows toward the exhaust port 10h. Further, the lateral gas supply port 85a supplies the etching gas in the direction perpendicular to the direction along the focal line L0 being the supply direction of the central gas supply port 81a.

The maximum flow rate of the etching gas from the lateral gas supply port 85a is larger than the maximum flow rate of the etching gas from the central gas supply port 81a, and the minimum flow rate of the etching gas from the lateral gas supply port 85a is larger than the minimum flow rate of the etching gas from the central gas supply port 81a. For example, the flow rate of the etching gas from the lateral gas supply port 85a is 60 to 120 slm, and the flow rate of the gas from the central gas supply port 81a is 50 to 100 slm.

4.2 Operation

Figure 9:
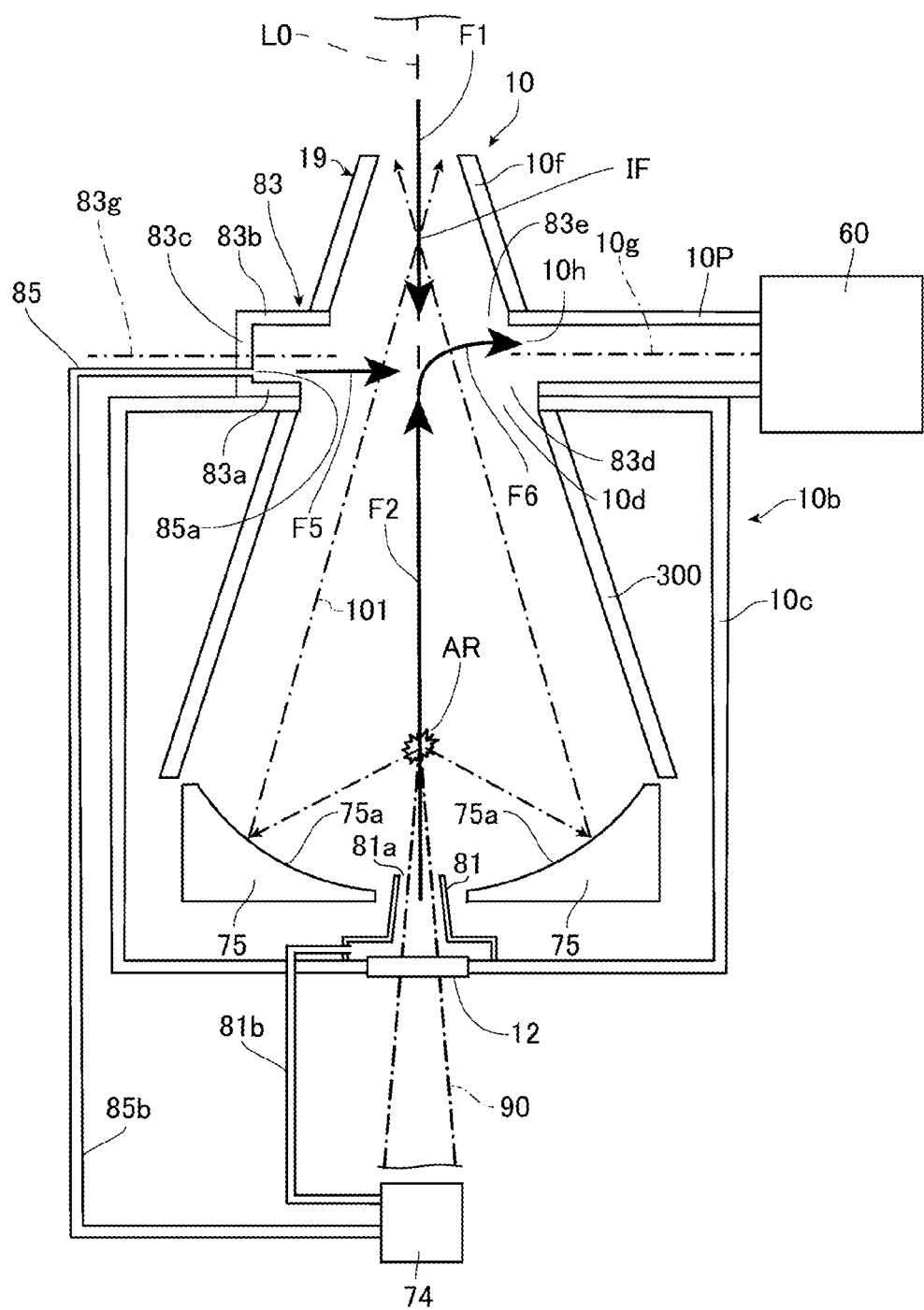
FIG. 9 is a view illustrating flow of etching gas from the exposure apparatus, flow of the etching gas from the central gas supply port, flow of the etching gas from the lateral gas supply port, and flow of the etching gas traveling to the exhaust port in Embodiment 1.

Next, operation of the central gas supply unit 81 and the lateral gas supply unit 85 in the present embodiment will be described. FIG. 9 is a view illustrating flow of the etching gas from the exposure apparatus 200, flow of the etching gas from the central gas supply port 81a, flow of the etching gas from the lateral gas supply port 85a, and flow of the etching gas traveling to the exhaust port 10h in the present embodiment.

In the present embodiment, similarly to the comparative example, in the central gas supply unit 81, the etching gas is supplied from the gas supply device 74 to the central gas supply port 81a through the pipe 81b, and is supplied from the central gas supply port 81a to the internal space of the chamber device 10. The supplied etching gas flows in the direction away from the reflection surface 75a along the focal line L0. In FIG. 9, the flow of the etching gas flowing in the direction away from the reflection surface 75a along the focal line L0 is indicated by the solid arrow F2. The etching gas passes through the opening 10d and the first opening 83d, and flows toward the internal space of the recessed portion 83.

In the present embodiment, in the lateral gas supply unit 85, the etching gas is supplied from the gas supply device 74 to the lateral gas supply port 85a through the pipe 85b, and is supplied from the lateral gas supply port 85a to the internal space of the recessed portion 83. The supplied etching gas flows along the direction perpendicular to the direction along the focal line L0. In FIG. 9, the flow of the etching gas flowing along the direction perpendicular to the direction along the focal line L0 is indicated by a solid arrow F5. Further, the etching gas from the lateral gas supply unit 85 flows toward the focal line L0 and the exhaust port 10h. The flowing etching gas is supplied toward the etching gas from the central gas supply port 81a, and collides with the etching gas from the central gas supply port 81a. Due to the collision, the etching gas from the lateral gas supply unit 85 bends the direction of the flow of some of the etching gas from the central gas supply port 81a from the direction along the focal line L0 toward the exhaust port 10h. In FIG. 9, the flow of the etching gas bent from the direction along the focal line L0 toward the exhaust port 10h is indicated by a solid arrow F6. Accordingly, some of the etching gas from the central gas supply port 81a flows toward the exhaust port 10h together with the etching gas from the lateral gas supply port 85a and the residual gas in the internal space of the chamber device 10. Further, some part of the etching gas from the central gas supply port 81a is sucked by the exhaust pump 60 from the exhaust port 10h through the exhaust pipe 10p together with the etching gas from the lateral gas supply port 85a and the residual gas.

Figure 10:
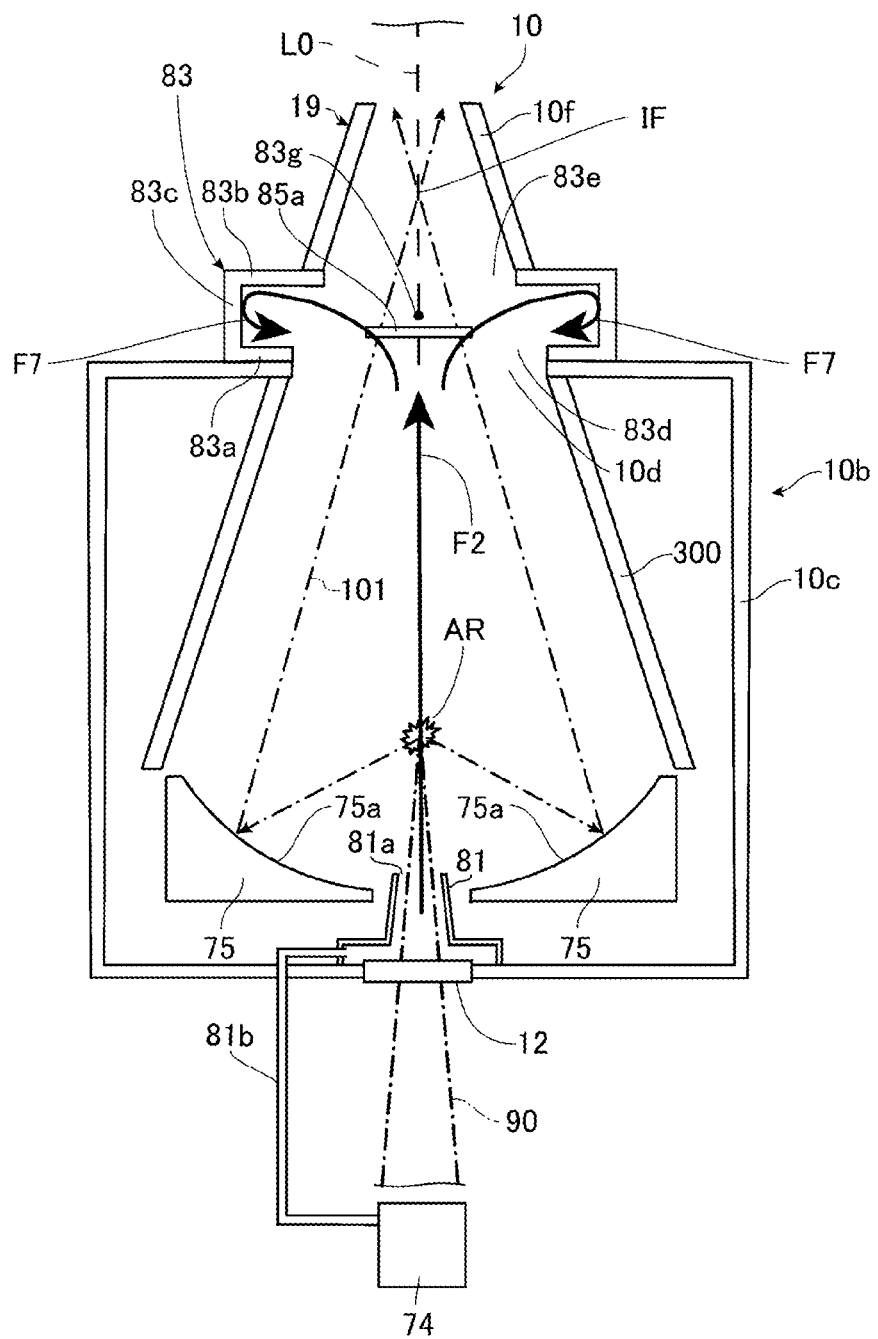
FIG. 10 is a view illustrating flow of the etching gas traveling into the recessed portion in Embodiment 1.

Further, in the present embodiment, when the etching gas from the lateral gas supply port 85a is supplied toward the etching gas from the central gas supply port 81a, some other part of the etching gas from the central gas supply port 81a collides with the etching gas from the lateral gas supply port 85a. Due to the collision, the etching gas from the lateral gas supply unit 85 bends the direction of some other part of the flow of the etching gas from the central gas supply port 81a from the direction along the focal line L0 toward the internal space of the recessed portion 83. Thus, some other part of the etching gas from the central gas supply port 81a travels into the internal space of the recessed portion 83 together with the residual gas. FIG. 10 is a view illustrating flow of the etching gas traveling into the internal space of the recessed portion 83. In FIG. 10, the flow of the etching gas traveling into the internal space of the recessed portion 83 is indicated by a solid arrow F7. Thus, the residual gas is prevented from staying in the internal space of the first wall portion 10c.

In the present embodiment, similarly to the comparative example, the etching gas is supplied from the exposure apparatus 200. The etching gas from the exposure apparatus 200 passes through the second opening 83e and flows toward the internal space of the recessed portion 83. In FIG. 9, the flow of the etching gas from the exposure apparatus 200 is indicated by the solid arrow F1. Some remaining part of the etching gas from the central gas supply port 81a collides with the etching gas from the exposure apparatus 200. Due to the collision, the direction of the remaining part of the flow of the etching gas from the central gas supply port 81a is bent from the direction along the focal line L0 toward the exhaust port 10h. Accordingly, the remaining part of the etching gas from the central gas supply port 81a flows toward the exhaust port 10h together with the etching gas from the exposure apparatus 200 and the residual gas in the internal space of the chamber device 10. Further, some of the etching gas from the central gas supply unit 81 is sucked by the exhaust pump 60 from the exhaust port 10h through the exhaust pipe 10p together with the etching gas from the exposure apparatus 200 and the residual gas.

4.3 Effect

In the chamber device 10 of the present embodiment, when viewed from the direction perpendicular to the focal line L0, the recessed portion 83 is disposed on the side lateral to the focal line L0 and is recessed outward from the heat shield 300 being the inner wall. The lateral gas supply port 85a is formed at the recessed portion 83. Further, the lateral gas supply port 85a supplies the etching gas toward the etching gas from the central gas supply port 81a so that the direction of the flow of some of the etching gas from the central gas supply port 81a is bent from the direction along the focal line L0 toward the exhaust port 10h.

Therefore, some part of the etching gas from the central gas supply port 81a collides with the etching gas from the lateral gas supply port 85a, bends toward the exhaust port 10h together with the residual gas due to the collision, and easily flows into the exhaust port 10h together with the residual gas. Therefore, traveling of the etching gas and the residual gas having high density of tin into the internal space of the second wall portion 10f is suppressed, adhesion of tin to the inner circumferential surface of the second wall portion 10f is suppressed, and contamination of the inner circumferential surface of the second wall portion 10f by tin is suppressed. Further, by suppressing adhesion of tin, obstruction of traveling of the EUV light 101 to the exposure apparatus 200 due to adhesion of tin is suppressed, and failure of the chamber device 10 due to falling of tin from the inner circumferential surface of the second wall portion 10f is suppressed.

Further, the lateral gas supply port 85a supplies the etching gas toward the etching gas from the central gas supply port 81a so that the direction of the flow of some other part of the etching gas from the central gas supply port 81a is bent from the direction along the focal line L0 toward the internal space of the recessed portion 83.

Therefore, some other part of the etching gas from the central gas supply port 81a collides with the etching gas from the lateral gas supply port 85a, and is bent toward the internal space side of the recessed portion 83 together with the residual gas due to the collision, and travels into the internal space of the recessed portion 83 together with the residual gas. Thus, staying of the residual gas in the internal space of the first wall portion 10c is suppressed, adhesion of tin to the inner circumferential surface of the heat shield 300 is suppressed even when tin is precipitated from the residual gas, and contamination of the inner circumferential surface of the heat shield 300 by tin is suppressed. Further, by suppressing adhesion of tin, obstruction of traveling of the EUV light 101 to the exposure apparatus 200 due to adhesion of tin is suppressed, and occurrence of failure of the chamber device 10 due to falling of tin from the inner circumferential surface of the heat shield 300 is suppressed.

As described above, some other part of the etching gas from the central gas supply port 81a is bent toward the internal space side of the recessed portion 83 together with the residual gas, and travels into the internal space of the recessed portion 83 together with the residual gas. Accordingly, even when tin is precipitated from the residual gas that has traveled to the recessed portion 83, the tin adheres to the bottom wall 83a of the recessed portion 83. Since the bottom wall 83a is recessed outward from the heat shield 300, even when tin adheres to the bottom wall 83a, failure of the chamber device 10 due to falling of tin from the bottom wall 83a is suppressed.

As described above, when the recessed portion 83 is provided and the etching gas from the central gas supply port 81a flows into the exhaust port 10h and the internal space of the recessed portion 83 due to the etching gas from the lateral gas supply port 85a, adhesion of tin to the second wall portion 10f and the heat shield 300, which are the inner walls disposed closest to the optical path of the EUV light 101, is suppressed, and occurrence of failure of the chamber device 10 is suppressed.

Therefore, in the chamber device 10 of the present embodiment, the etching gas is supplied from the lateral gas supply port 85a formed in the recessed portion 83 to the internal space of the chamber device 10, thereby suppressing failure of the chamber device 10 caused by the etching gas which is difficult to flow to the exhaust port 10h.

Further, in the chamber device 10 of the present embodiment, the lateral gas supply port 85a supplies the etching gas in the direction perpendicular to the supply direction of the etching gas from the central gas supply port 81a. Therefore, the direction of the flow of the etching gas from the central gas supply port 81a may be bent from the direction along the focal line L0 into the direction perpendicular to the focal line L0, and the etching gas from the central gas supply port 81a may easily flow into the exhaust port 10h and the recessed portion 83 disposed on the side lateral to the focal line L0.

Further, in the chamber device 10 of the present embodiment, the direction along the center axis 10g of the exhaust port 10h is perpendicular to the focal line L0, and the lateral gas supply port 85a is formed to face the exhaust port 10h. Accordingly, the etching gas from the central gas supply port 81a bent from the direction along the focal line L0 into the direction perpendicular to the focal line L0 can easily flow into the exhaust port 10h.

Further, in the chamber device 10 of the present embodiment, the minimum flow rate of the etching gas from the lateral gas supply port 85a is larger than the minimum flow rate of the etching gas from the central gas supply port 81a, and the maximum flow rate of the etching gas from the lateral gas supply port 85a is larger than the maximum flow rate of the etching gas from the central gas supply port 81a. Thus, the direction of the flow of the etching gas from the central gas supply port 81a can be easily bent by the etching gas from the lateral gas supply port 85a.

Further, in the chamber device 10 of the present embodiment, when viewed from the direction perpendicular to the focal line L0, the lateral gas supply port 85a is formed on the EUV light concentrating mirror 75 side located below the center axis 83g of the recessed portion 83. Thus, the direction of the flow of the etching gas from the central gas supply port 81a is bent on the side close to the EUV light concentrating mirror 75, and the etching gas from the central gas supply port 81a can easily flow into the exhaust port 10h.

Here, it is sufficient for the 85a to supply the etching gas toward the etching gas from the central gas supply port 81a so that the etching gas from the lateral gas supply port 85a collides with the etching gas from the central gas supply port 81a and, due to the collision, the direction of the flow of the etching gas from the central gas supply port 81a is bent into the direction substantially perpendicular to the focal line L0 from the direction along the focal line L0. Further, the recessed portion 83 and the exhaust port 10h may be formed ahead in the direction of the flow of the collided etching gas from the central gas supply port 81a. The lateral gas supply port 85a is formed to face the exhaust port 10h, but is not necessarily limited thereto. At least a part of the lateral gas supply port 85a may be formed to face the exhaust port 10h. The shape of the lateral gas supply port 85a may be the same as the shape of the exhaust port 10h or may be different from the shape of the exhaust port 10h. Further, the pipe 85b may extend to the internal space of the recessed portion 83, and the lateral gas supply port 85a may be formed in the internal space of the recessed portion 83. A plurality of lateral gas supply ports 85a may be formed, and the plurality of lateral gas supply ports 85a may be formed on the circumference of the same circle with reference to the focal line L0. Each of the lateral gas supply ports 85a may be formed as facing the exhaust port 10h. The recessed portion 83 is separately formed from the first wall portion 10c and the second wall portion 10f, but may be integrally formed with at least one of the first wall portion 10c and the second wall portion 10f. The recessed portion 83 does not need to be provided on the same plane as the exhaust port 10h, and may be disposed so as to be deviated from the exhaust port 10h in the direction along the focal line L0. Further, the recessed portion 83 may be disposed on the side closer to the EUV light concentrating mirror 75 with respect to the exhaust port 10h in the direction along the focal line L0. The side wall 83c of the recessed portion 83 does not need to be substantially C-shaped, and may have another shape such as a rectangular shape, or may be provided on the circumference of the same circle with reference to the focal line L0. Further, at least one recessed portion 83 may be provided on the circumference of the same circle with reference to the focal line L0. When a plurality of recessed portions 83 are provided, the lateral gas supply ports 85a may be formed in the recessed portions 83 respectively, or may be formed in any of the recessed portions 83. Although the second wall portion 10f and the heat shield 300 are provided as the inner walls disposed closest to the optical path of the EUV light 101, the inner walls are not limited thereto. For example, if the heat shield 300 is not provided, the inner walls are the first wall portion 10c and the second wall portion 10f. Further, if another wall portion is disposed inside the heat shield 300, the wall portion can be the inner wall. The inner peripheral surface of the second wall portion 10f may not be disposed on the same plane as the inner peripheral surface of the heat shield 300.

5. Description of EUV Light Generation Apparatus of Embodiment 2

Next, a configuration of the EUV light generation apparatus 100 of Embodiment 2 will be described. Any component same as that described above is denoted by an identical reference sign, and duplicate description thereof is omitted unless specific description is needed.

5.1 Configuration

Figure 11:
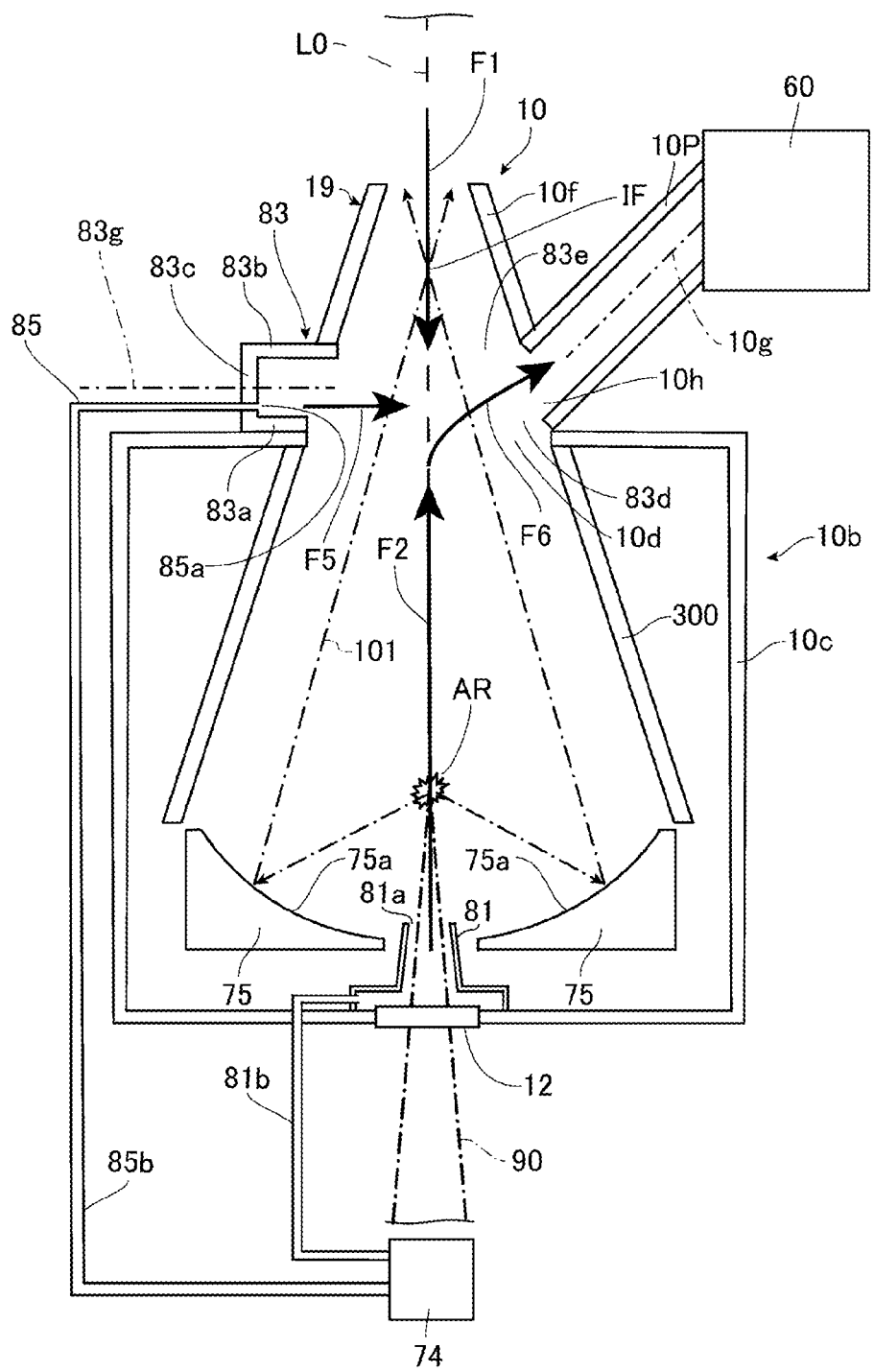
FIG. 11 is a view illustrating an exemplary schematic configuration of a part including the chamber device in Embodiment 2.

FIG. 11 is a view illustrating a schematic exemplary configuration of a part including the chamber device 10 in the present embodiment. In the chamber device 10 of the present embodiment, arrangement of the exhaust port 10h and the exhaust pipe 10p is different from arrangement of the exhaust port 10h and the exhaust pipe 10p of Embodiment 1.

In the present embodiment, the direction along the center axis 10g of the exhaust port 10h is inclined with respect to the focal line L0 so that the exhaust port 10h is formed to face the plasma generation region AR side. The direction along the center axis 10g of the exhaust port 10h is inclined at 45° with respect to the focal line L0, for example.

5.2 Effect

In the present embodiment, the etching gas from the central gas supply port 81a may more easily flow into the exhaust port 10h as indicated by the arrow F6, compared with the case where the direction along the center axis 10g of the exhaust port 10h is perpendicular to the focal line L0. A bending angle of the etching gas being bent from the direction along the focal line L0 toward the exhaust port 10h is assumed to be an angle formed by three points of the plasma generation region AR, the collision point, and the center of the exhaust port 10h. The collision point represents a position where the etching gas from the central gas supply port 81a and the etching gas from the lateral gas supply port 85a collide with each other. The bending angle of the etching gas in the present embodiment may be larger than the bending angle of the etching gas in Embodiment 1. Therefore, as compared with Embodiment 1, the supply amount of the etching gas from the lateral gas supply port 85a can be reduced.

Further, when the etching gas from the central gas supply port 81a easily flows into the exhaust port 10h, traveling of the etching gas and the residual gas having high density of tin into the internal space of the second wall portion 10f is further suppressed. Therefore, adhesion of tin to the inner circumferential surface of the second wall portion 10f can be further suppressed. Further, by suppressing adhesion of tin, obstruction of traveling of the EUV light 101 to the exposure apparatus 200 due to adhesion of tin can be further suppressed, and failure of the chamber device 10 due to falling of tin from the inner circumferential surface of the second wall portion 10f can be further suppressed.

6. Description of EUV Light Generation Apparatus of Embodiment 3

Next, a configuration of the EUV light generation apparatus 100 of Embodiment 3 will be described. Any component same as that described above is denoted by an identical reference sign, and duplicate description thereof is omitted unless specific description is needed.

6.1 Configuration

Figure 12:
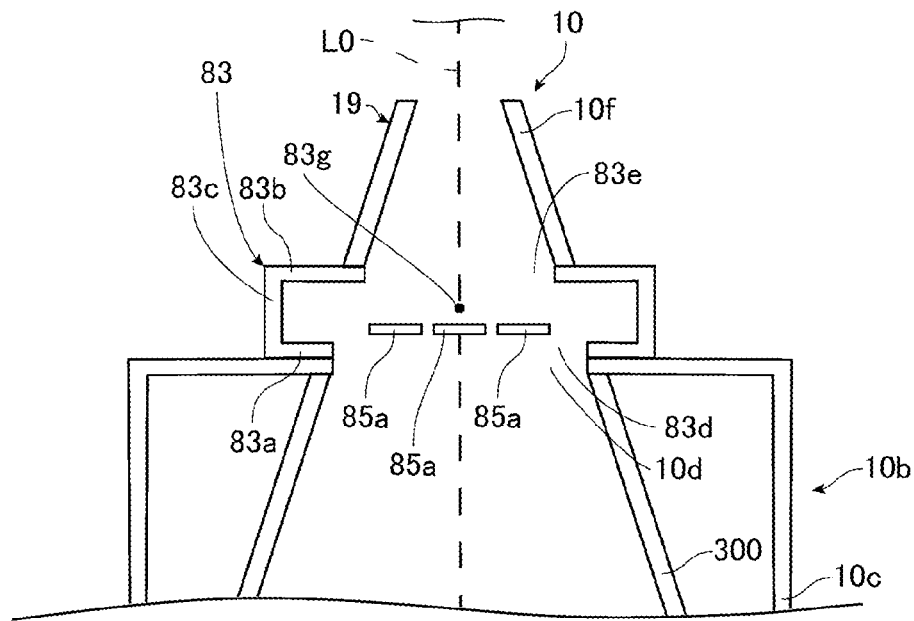
FIG. 12 is a view illustrating an exemplary schematic configuration of a part including the chamber device when the lateral gas supply port is viewed from the exhaust port in Embodiment 3.

FIG. 12 is a view illustrating an exemplary schematic configuration of a part including the chamber device 10 when the lateral gas supply port 85a is viewed from the exhaust port 10h in the present embodiment. In the chamber device 10 of the present embodiment, the number of the lateral gas supply ports 85a is different from the number of the lateral gas supply ports 85a of Embodiment 1.

In the present embodiment, the chamber device 10 includes a plurality of lateral gas supply ports 85a. FIG. 12 illustrates an example in which three lateral gas supply ports 85a are formed. Although not illustrated, each of the lateral gas supply ports 85a is connected to the gas supply device 74 individually through the pipe 85b.

6.2 Effect

By forming the plurality of lateral gas supply ports 85a, the flow rate of the etching gas from the lateral gas supply ports 85a may be easily controlled compared with the case where one lateral gas supply port 85a is formed. Flow rates of the etching gas respectively from the lateral gas supply ports 85a may be different from each other or may be the same.

Figure 13:
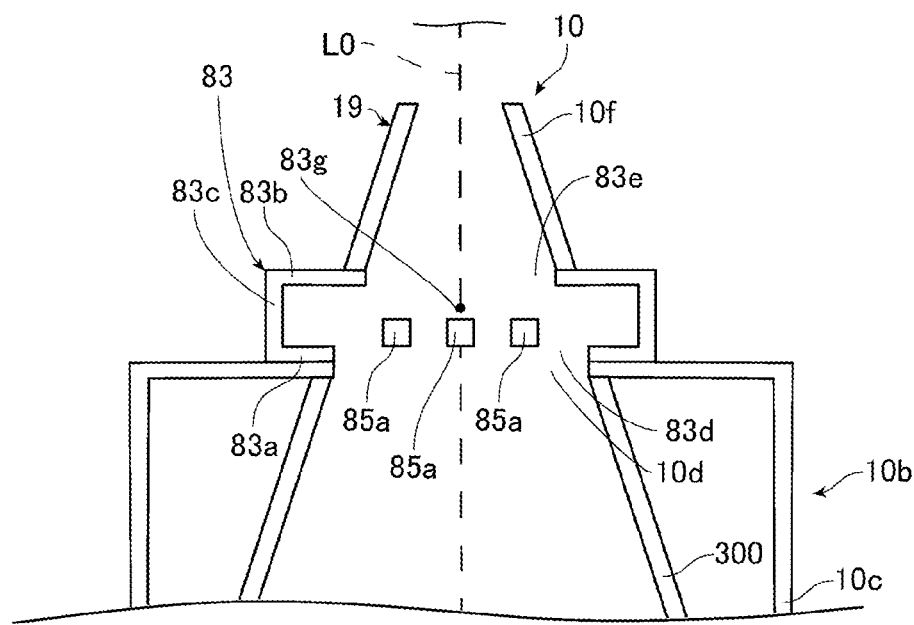
FIG. 13 is a view illustrating a modification of a shape of the lateral gas supply port.
Figure 14:
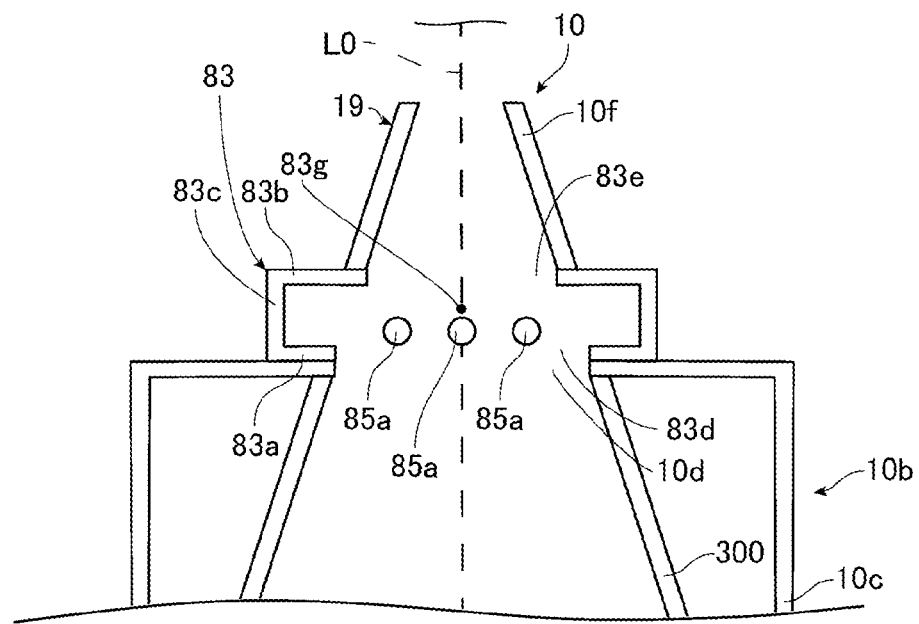
FIG. 14 is a view illustrating another modification of the shape of the lateral gas supply port.
Figure 15:
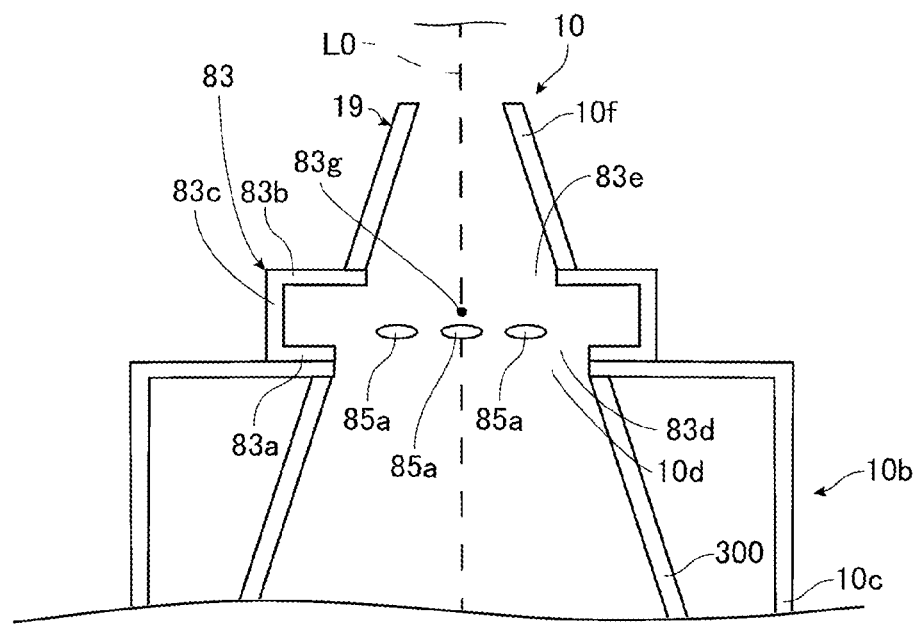
FIG. 15 is a view illustrating another modification of the shape of the lateral gas supply port.
Figure 16:
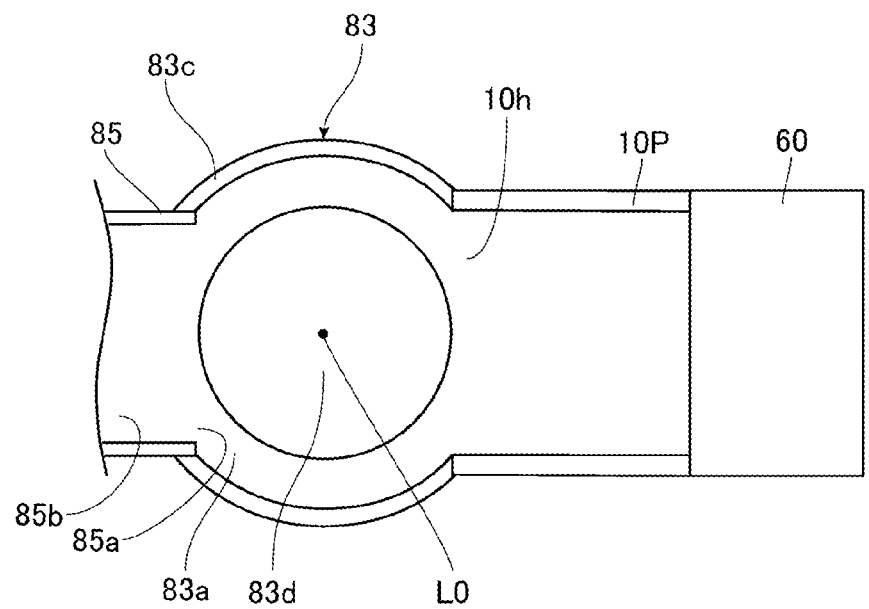
FIG. 16 is a view illustrating a modification of a size of the lateral gas supply port.

The shape of each of the lateral gas supply ports 85a is not necessarily limited to a rectangular shape as in Embodiment 1, and may be, for example, any of a square shape illustrated in FIG. 13, a circular shape illustrated in FIG. 14, and an elliptical shape illustrated in FIG. 15. The size of the lateral gas supply ports 85a does not need to be smaller than the size of the exhaust port 10h of Embodiment 1, and may be substantially equal to the size of the exhaust port 10h as illustrated in FIG. 16. In this case, the lateral gas supply ports 85a and the exhaust port 10h each have a rectangular shape, and the lengths of the sides of the lateral gas supply ports 85a are substantially equal to the lengths of the sides of the exhaust port 10h. The length of at least one side of the lateral gas supply ports 85a may be substantially equal to the length of at least one side of the exhaust port 10h. The size of the lateral gas supply ports 85a may be larger than the size of the exhaust port 10h.

7. Description of EUV Light Generation Apparatus of Embodiment 4

Next, a configuration of an EUV light generation apparatus 100 of Embodiment 4 will be described. Any component same as that described above is denoted by an identical reference sign, and duplicate description thereof is omitted unless specific description is needed.

7.1 Configuration

Figure 17:
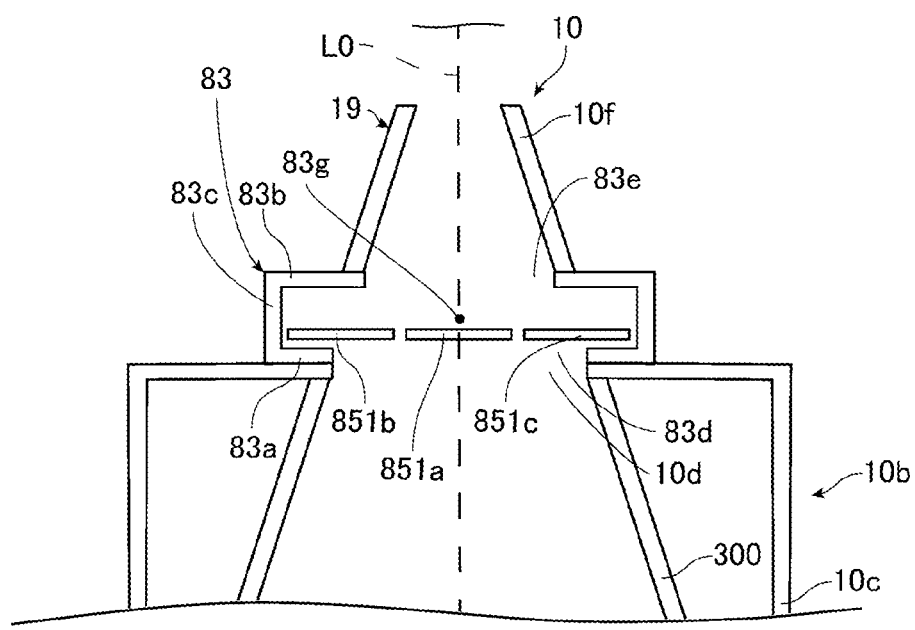
FIG. 17 is a view illustrating an exemplary schematic configuration of a part including the chamber device when the lateral gas supply port is viewed from the exhaust port in Embodiment 4.
Figure 18:
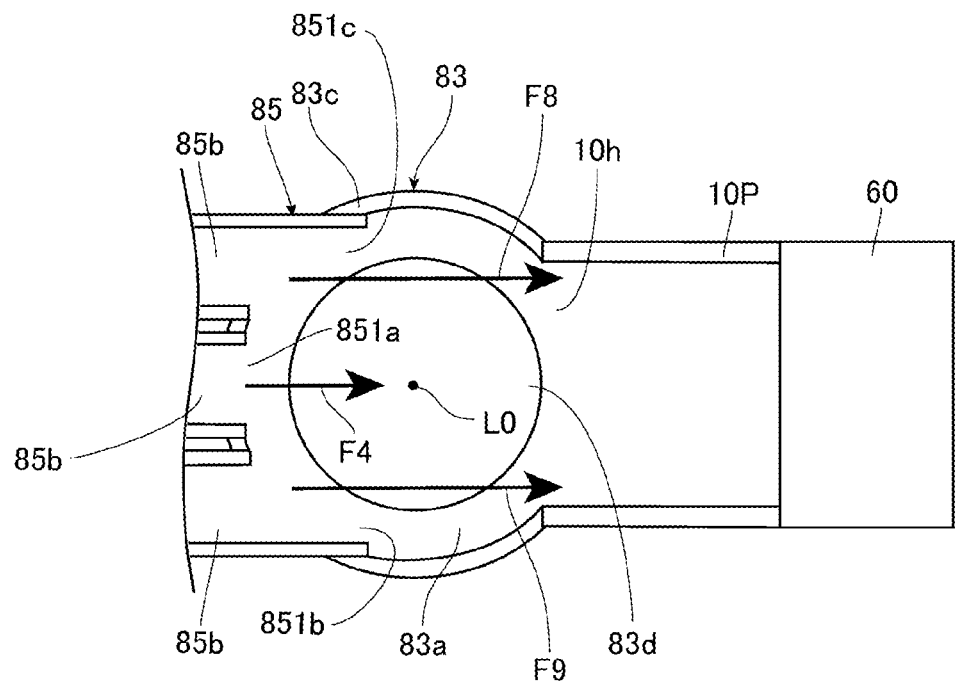
FIG. 18 is a view illustrating flow of etching gas from the lateral gas supply port when the configuration of the recessed portion is viewed along the focal line in Embodiment 4.

FIG. 17 is a view illustrating an exemplary schematic configuration of a part including the chamber device 10 when the lateral gas supply port 85a is viewed from the exhaust port 10h in the present embodiment. FIG. 18 is a view illustrating flow of the etching gas from the lateral gas supply port 85a when the configuration of the recessed portion 83 is viewed along the focal line L0 in the present embodiment. In the chamber device 10 of the present embodiment, arrangement of the lateral gas supply ports is different from arrangement of the lateral gas supply ports 85a of Embodiment 3.

Here, for convenience of description, three lateral gas supply ports will be described as a first lateral gas supply port 851a, a second lateral gas supply port 851b, and a third lateral gas supply port 851c.

The first lateral gas supply port 851a is disposed in the same manner as the lateral gas supply port 85a of Embodiment 1. When viewed from the direction perpendicular to the focal line L0, the first lateral gas supply port 851a is disposed between the second lateral gas supply port 851b and the third lateral gas supply port 851c.

A part of the second lateral gas supply port 851b is provided at a position not overlapping with the first opening 83d of the recessed portion 83 in the direction along the focal line L0. Here, at least a part of the second lateral gas supply port 851b may be provided at a position not overlapping with the first opening 83d of the recessed portion 83. Further, the second lateral gas supply port 851b is formed on the side closer to the EUV light concentrating mirror 75 with respect to a plane being perpendicular to the focal line L0 and passing through the center axis 83g of the recessed portion 83. Accordingly, the second lateral gas supply port 851b is formed between the plane and the EUV light concentrating mirror 75. The second lateral gas supply port 851b supplies the etching gas toward the exhaust port 10h from the internal space of the recessed portion 83 so that the etching gas from the second lateral gas supply port 851b flows toward the exhaust port 10h from the internal space of the recessed portion 83. In FIG. 18, the flow of the etching gas flowing from the second lateral gas supply port 851b toward the exhaust port 10h through the internal space of the recessed portion 83 is indicated by a solid arrow F8. Here, the etching gas from the second lateral gas supply port 851b may flow toward the exhaust port 10h along the side wall 83c and the bottom wall 83a. Although description has been provided here on the second lateral gas supply port 851b, the third lateral gas supply port 851c is disposed in the same manner as the second lateral gas supply port 851b and supplies the etching gas in the same manner as the second lateral gas supply port 851b. In FIG. 18, the flow of the etching gas flowing from the third lateral gas supply port 851c to the exhaust port 10h through the internal space of the recessed portion 83 is indicated by a solid arrow F9. Here, the etching gas from the third lateral gas supply port 851*c* may flow toward the exhaust port 10*h* along the side wall 83*c* and the bottom wall 83*a*.

In the present embodiment, each of the first lateral gas supply port 851*a*, the second lateral gas supply port 851*b*, and the third lateral gas supply port 851*c* is individually connected to the gas supply device 74 through the pipe 85*b*. Flow rates of the etching gas respectively from the first lateral gas supply port 851*a*, the second lateral gas supply port 851*b*, and the third lateral gas supply port 851*c* may be different from each other or may be the same.

7.2 Effect

In the present embodiment, the etching gas from the second lateral gas supply port 851*b* flows toward the exhaust port 10*h* from the internal space of the recessed portion 83. The flowing etching gas flows toward the exhaust port 10*h* together with the residual gas in the internal space of the recessed portion 83, and is sucked from the exhaust port 10*h* to the exhaust pump 60 through the exhaust pipe 10*p* together with the residual gas. Therefore, generation of tin from the residual gas in the internal space of the recessed portion 83 and adhesion of tin to the recessed portion 83 are suppressed. When adhesion of tin is suppressed, obstruction of traveling of the etching gas from the central gas supply port 81*a* to the recessed portion 83 due to adhesion of tin is suppressed, and failure of the chamber device 10 due to falling of tin from the recessed portion 83 can be suppressed. Although description has been provided here on the second lateral gas supply port 851*b*, the third lateral gas supply port 851*c* also has the same operation and effects as those of the second lateral gas supply port 851*b*. Here, the second lateral gas supply port 851*b* may be formed on the side closer to the exposure apparatus 200 with respect to a plane being perpendicular to the focal line L0 and passing through the center axis 83*g* of the recessed portion 83. Accordingly, the second lateral gas supply port 851*b* may be formed between the plane and the exposure apparatus 200. Although description has been provided here on the second lateral gas supply port 851*b*, the third lateral gas supply port 851*c* may be disposed in the same manner as the second lateral gas supply port 851*b*.

Next, modifications of the present embodiment will be described.

Figure 19:
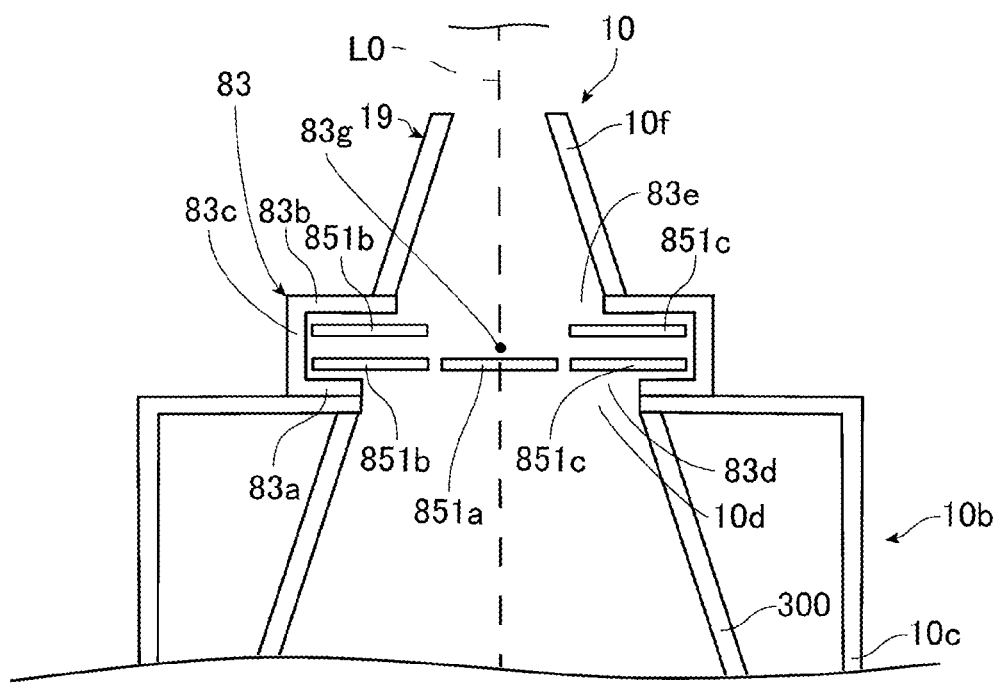
FIG. 19 is a view illustrating Modification 1 of Embodiment 4.

FIG. 19 is a view illustrating Modification 1 of Embodiment 4. As illustrated in FIG. 19, a plurality of the second lateral gas supply ports 851*b* may be formed. FIG. 19 illustrates an example in which two second lateral gas supply ports 851*b* are formed. The second lateral gas supply ports 851*b* are formed respectively on the side closer to the EUV light concentrating mirror 75 and on the side closer to the exposure apparatus 200 with respect to the plane being perpendicular to the focal line L0 and passing through the center axis 83*g* of the recessed portion 83. Although description has been provided here on the second lateral gas supply port 851*b*, the third lateral gas supply port 851*c* is disposed in the same manner as the second lateral gas supply port 851*b*. Although not illustrated, the first lateral gas supply port 851*a* may also be disposed in the same manner as the second lateral gas supply port 851*b*. Accordingly, generation of tin from the residual gas in the internal space of the recessed portion 83 and adhesion of tin to the recessed portion 83 are further suppressed. When adhesion of tin is suppressed, obstruction of traveling of the etching gas from the central gas supply port 81*a* to the recessed portion 83 due to adhesion of tin is further suppressed, and failure of the chamber device 10 due to falling of tin from the recessed portion 83 can be further suppressed.

Figure 20:
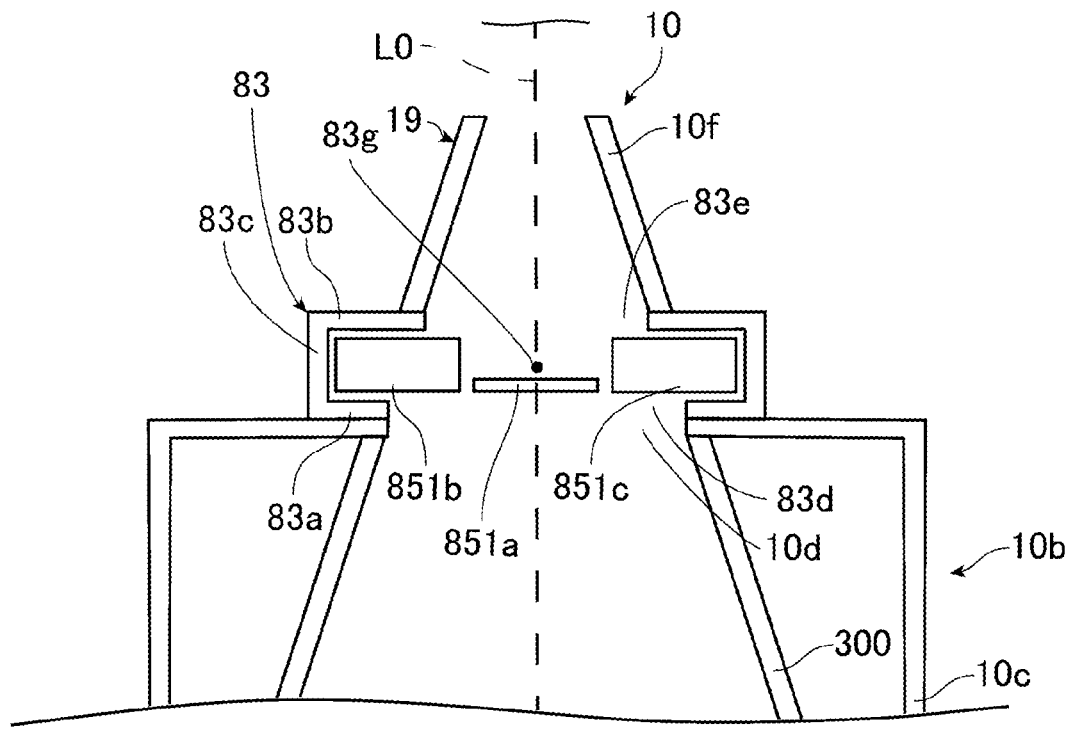
FIG. 20 is a view illustrating Modification 2 of Embodiment 4.

FIG. 20 is a view illustrating Modification 2 of Embodiment 4. As illustrated in FIG. 20, one second lateral gas supply port 851*b* is formed over between the side closer to the EUV light concentrating mirror 75 and the side closer to the exposure apparatus 200 with respect to the plane being perpendicular to the focal line L0 and passing through the center axis 83*g* of the recessed portion 83. Although description has been provided here on the second lateral gas supply port 851*b*, the third lateral gas supply port 851*c* is disposed in the same manner as the second lateral gas supply port 851*b*. Although not illustrated, the first lateral gas supply port 851*a* may also be disposed in the same manner as the second lateral gas supply port 851*b*.

Figure 21:
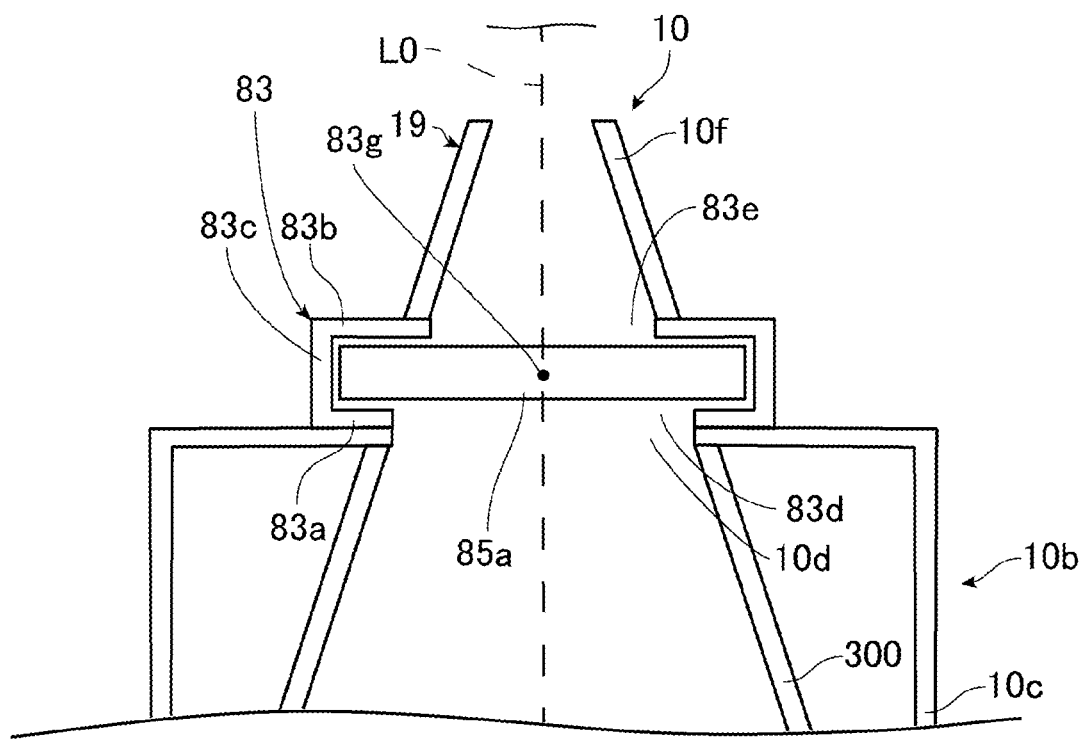
FIG. 21 is a view illustrating Modification 3 of Embodiment 4.

FIG. 21 is a view illustrating Modification 3 of Embodiment 4. As illustrated in FIG. 21, in the direction along the focal line L0, a part of one lateral gas supply port 85*a* may be provided at a position not overlapping with the first opening 83*d* of the recessed portion 83, and another part of one lateral gas supply port 85*a* may be provided at a position overlapping with the first opening 83*d* of the recessed portion 83.

In this case, according to the etching gas from the one lateral gas supply port 85*a*, the direction of the flow of the etching gas from the central gas supply port 81*a* can be bent from the direction along the focal line L0 toward the exhaust port 10*h*, and generation of tin from the residual gas in the internal space of the recessed portion 83 and adhesion of tin to the recessed portion 83 can be suppressed. Further, compared with the case where a plurality of lateral gas supply ports 85*a* are formed, the number of lateral gas supply ports 85*a* is reduced, and the number of components in the chamber device 10 can be reduced.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims should be interpreted as non-limiting terms unless clearly described. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of the any thereof and any other than A, B, and C.

What is claimed is:

1. A chamber device, comprising:
   a concentrating mirror including a spheroidal reflection surface configured to reflect extreme ultraviolet light generated from plasma in a plasma generation region where the plasma is generated from a droplet to which a laser light is radiated;
   a central gas supply port configured to supply gas along a focal line passing through a first focal point and a second focal point of the reflection surface from a center side of the reflection surface;
   an inner wall disposed closest to an optical path of the extreme ultraviolet light in the chamber device;
   an exhaust port configured to exhaust the gas in the chamber device and disposed on a side lateral to the focal line on the opposite side to concentrating mirror with respect to the plasma generation region when viewed from a direction perpendicular to the focal line;

a recessed portion disposed on a side lateral to the focal line and recessed outward from the inner wall when viewed from a direction perpendicular to the focal line; and a lateral gas supply port formed at the recessed portion and configured to supply gas toward the gas supplied from the central gas supply port so that a flow direction of the gas supplied from the central gas supply port is bent from a direction along the focal line toward the exhaust port and an internal space of the recessed portion.

2. The chamber device according to claim 1, wherein the lateral gas supply port supplies the gas in a direction perpendicular to the gas supply direction from the central gas supply port.

3. The chamber device according to claim 2,
wherein a center axis direction of the exhaust port is perpendicular to the focal line, and
the lateral gas supply port is formed to face the exhaust port.

4. The chamber device according to claim 1,
wherein height of the recessed portion in a direction along the focal line is 100 to 150 mm, and
depth of the recessed portion perpendicular to the focal line is 50 to 100 mm.

5. The chamber device according to claim 1,
wherein a minimum flow rate of the gas supplied from the lateral gas supply port is larger than a minimum flow rate of the gas supplied from the central gas supply port, and
a maximum flow rate of the gas supplied from the lateral gas supply port is larger than a maximum flow rate of the gas supplied from the central gas supply port.

6. The chamber device according to claim 5,
wherein a flow rate of the gas supplied from the central gas supply port is 50 to 100 slm, and
a flow rate of the gas supplied from the lateral gas supply port is 60 to 120 slm.

7. The chamber device according to claim 1, wherein the lateral gas supply port is formed on a side closer to the concentrating mirror with respect to the center axis of the recessed portion perpendicular to the focal line when viewed from a direction perpendicular to the focal line.

8. The chamber device according to claim 1, further comprising a first wall portion disposed on a side lateral to the first focal point where the plasma generation region is located,
wherein the inner wall includes a heat shield disposed between the first wall portion and the plasma generation region, and a second wall portion disposed on a side lateral to the second focal point.

9. The chamber device according to claim 1, wherein the center axis direction of the exhaust port is inclined with respect to the focal line such that the exhaust port faces the plasma generation region.

10. The chamber device according to claim 1, wherein a plurality of the lateral gas supply ports are formed.

11. The chamber device according to claim 10,
wherein the recessed portion has a bottom wall including an opening through which the gas from the central gas supply port passes,
at least a part of the lateral gas supply port of any of the plurality of lateral gas supply ports is provided at a position not overlapping with the opening of the recessed portion in the direction along the focal line, and the lateral gas supply port formed at the position not overlapping with the opening supplies the gas from the internal space of the recessed portion toward the exhaust port.

12. The chamber device according to claim 11,
wherein the lateral gas supply port is formed on a side closer to the concentrating mirror with respect to the center axis of the recessed portion perpendicular to the focal line.

13. The chamber device according to claim 11,
wherein the lateral gas supply port is formed on a side closer to an exposure apparatus with respect to the center axis of the recessed portion.

14. The chamber device according to claim 1,
wherein the recessed portion has a bottom wall including an opening through which the gas from the central gas supply port passes,
a part of the lateral gas supply port is provided at a position not overlapping with the opening of the recessed portion in the direction along the focal line, and
the lateral gas supply port supplies the gas from the internal space of the recessed portion toward the exhaust port.

15. The chamber device according to claim 1, wherein a size of the lateral gas supply port is substantially equal to a size of the exhaust port.

16. The chamber device according to claim 1,
wherein the lateral gas supply port and the exhaust port each have a rectangular shape, and
length of at least one side of the lateral gas supply port is substantially equal to length of at least one side of the exhaust port.

17. An extreme ultraviolet light generation apparatus, comprising:
a laser device configured to irradiate a droplet with laser light in a plasma generation region; and
a chamber device,
the chamber device including:
a concentrating mirror including a spheroidal reflection surface configured to reflect extreme ultraviolet light generated from plasma in the plasma generation region where the plasma is generated from the droplet to which the laser light is radiated;
a central gas supply port configured to supply gas along a focal line passing through a first focal point and a second focal point of the reflection surface from a center side of the reflection surface;
an inner wall disposed closest to an optical path of the extreme ultraviolet light in the chamber device;
an exhaust port configured to exhaust the gas in the chamber device and disposed on a side lateral to the focal line on the opposite side to concentrating mirror with respect to the plasma generation region when viewed from a direction perpendicular to the focal line;
a recessed portion disposed on a side lateral to the focal line and recessed outward from the inner wall when viewed from a direction perpendicular to the focal line; and
a lateral gas supply port formed at the recessed portion and configured to supply gas toward the gas supplied from the central gas supply port so that a flow direction of the gas supplied from the central gas supply port is bent from a direction along the focal line toward the exhaust port and an internal space of the recessed portion.

18. An electronic device manufacturing method, comprising:

generating plasma by irradiating a droplet with laser light using an extreme ultraviolet light generation apparatus;

emitting extreme ultraviolet light generated from the plasma to an exposure apparatus; and exposing a photosensitive substrate to the extreme ultraviolet light in the exposure apparatus to produce an electronic device, the extreme ultraviolet light generation apparatus including:

a laser device configured to irradiate the droplet with the laser light in a plasma generation region; and a chamber device, the chamber device including:

a concentrating mirror including a spheroidal reflection surface configured to reflect extreme ultraviolet light generated from plasma in the plasma generation region where the plasma is generated from the droplet to which the laser light is radiated;

a central gas supply port configured to supply gas along a focal line passing through a first focal point and a second focal point of the reflection surface from a center side of the reflection surface;

an inner wall disposed closest to an optical path of the extreme ultraviolet light in the chamber device;

an exhaust port configured to exhaust the gas in the chamber device and disposed on a side lateral to the focal line on the opposite side to concentrating mirror with respect to the plasma generation region when viewed from a direction perpendicular to the focal line;

a recessed portion disposed on a side lateral to the focal line and recessed outward from the inner wall when viewed from a direction perpendicular to the focal line; and a lateral gas supply port formed at the recessed portion and configured to supply gas toward the gas supplied from the central gas supply port so that a flow direction of the gas supplied from the central gas supply port is bent from a direction along the focal line toward the exhaust port and an internal space of the recessed portion.

\* \* \* \* \*